United States Patent
Podgorski

[19]

[11] Patent Number: 6,127,980

[45] Date of Patent: *Oct. 3, 2000

[54] DUAL POLARIZATION ELECTROMAGNETIC FIELD SIMULATOR

[76] Inventor: Andrew S. Podgorski, 332 Crestview Road, Ottawa, Ontario, Canada, K1H 5G6

[*] Notice: This patent is subject to a terminal disclaimer.

[21] Appl. No.: 09/365,842

[22] Filed: Aug. 3, 1999

Related U.S. Application Data

[62] Division of application No. 09/043,528, filed as application No. PCT/CA96/00645, Mar. 24, 1998, Pat. No. 5,982,331.
[60] Provisional application No. 60/006,305, Sep. 26, 1995.

[30] Foreign Application Priority Data

Jun. 21, 1996 [CA] Canada .................................. 2179703

[51] Int. Cl.⁷ .......................... H01Q 13/02; G01R 29/10

[52] U.S. Cl. ........................................... 343/703; 343/786

[58] Field of Search ..................... 343/703, 786; H01Q 13/02

[56] References Cited

U.S. PATENT DOCUMENTS

| | | | |
|---|---|---|---|
| 4,962,384 | 10/1990 | Walker | 343/786 |
| 5,039,949 | 8/1991 | Hemming et al. | 343/703 |
| 5,237,283 | 8/1993 | Carbonini | 324/627 |
| 5,440,316 | 8/1995 | Podgorski et al. | 343/703 |
| 5,757,194 | 5/1998 | Yun | 343/703 |
| 5,982,331 | 11/1999 | Podgorski | 343/703 |

FOREIGN PATENT DOCUMENTS

WO 93/03387  2/1993  WIPO .

*Primary Examiner*—Michael C. Wimer
*Attorney, Agent, or Firm*—Jones, Tullar & Cooper, P.C.

[57] ABSTRACT

An electromagnetic simulator for testing the behavior of equipment in the presence of strong electromagnetic fields includes radiating horns at opposite sides of the test area. Conical or semi-conical horns may be used. Each horn has a conducting septum asymmetrically positioned in the horns and extending forwardly into the chamber. Each conducting septum is coupled to a conducting array extending along a wall of the chamber so that each array establishes a corresponding electromagnetic field in the test area.

4 Claims, 26 Drawing Sheets

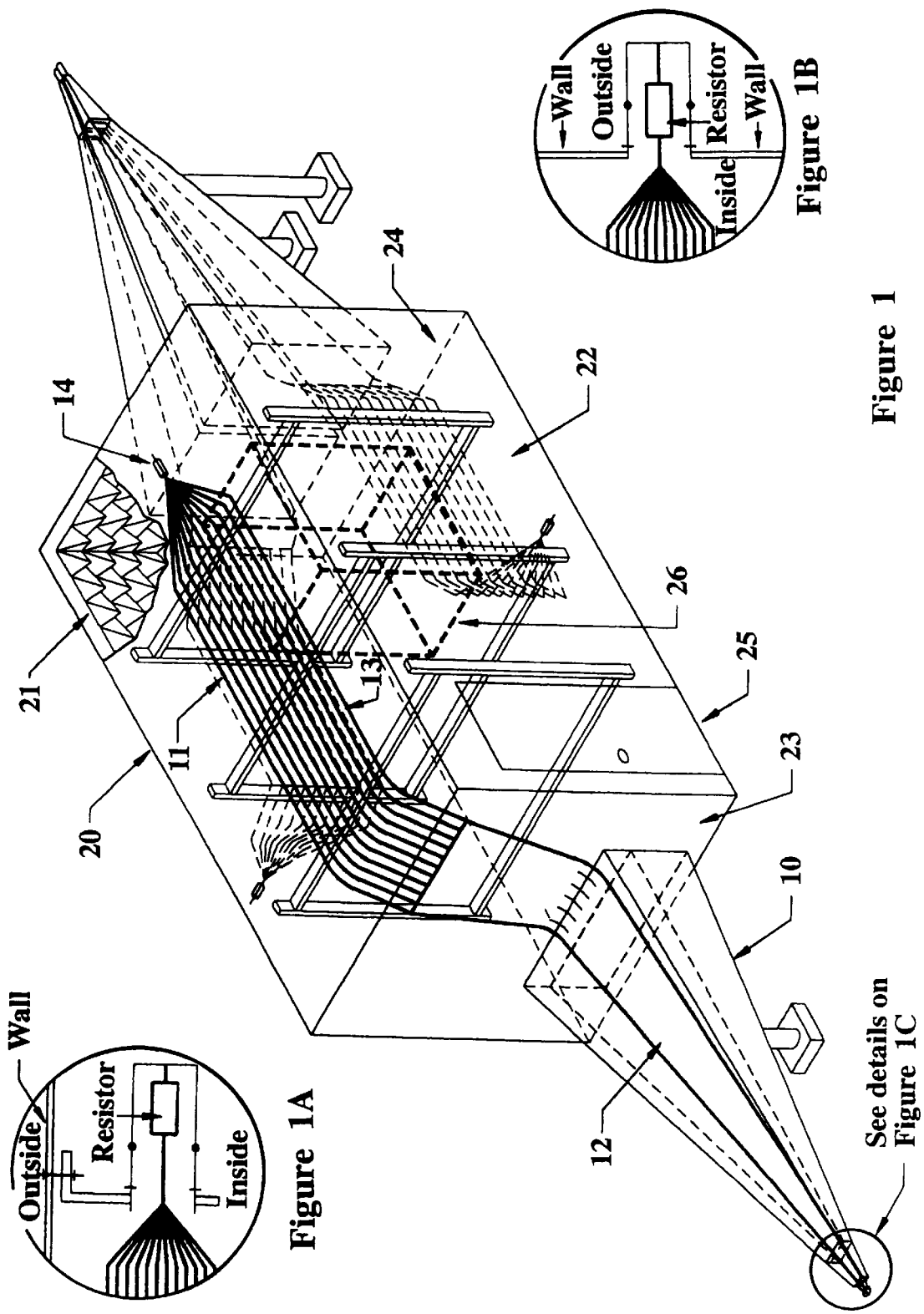

DUAL POLARIZATION ELECTROMAGNETIC FIELD SIMULATOR

This is a division of U.S. application Ser. No. 09/043,528, filed Mar. 24, 1998, now U.S. Pat. No. 5,982,331, which was the National Stage of International Application No. PCT/CA 96/00645, filed Mar. 24, 1998, published as WO97/12251, Apr. 3, 1997. This application claims the benefit of U.S. Provisional Application No. 60/006,305, filed Sep. 26, 1995.

BACKGROUND OF THE INVENTION

This invention relates to electromagnetic simulators used for testing the behaviour of equipment in the presence of strong electromagnetic fields. The simulator of this invention provides for the simultaneous presence of electromagnetic fields of differing polarization in a test area.

Electromagnetic simulators are disclosed in U.S. Pat. No. 5,440,316 issued Aug. 8, 1995 to Podgorski. The structure shown in FIG. 5 of that patent is a simulator employing vertically polarized electromagnetic waves in the test area and the structure shown in FIG. 10 is a simulator employing horizontally polarized waves in the test area.

SUMMARY OF THE INVENTION

This application relates to simulator structures which produce electromagnetic waves of differing polarization in the test area at the same time, thereby reducing the testing time.

DESCRIPTION OF THE DRAWINGS

The foregoing, and additional objects, features, and advantages of the present invention will become apparent to those of skill in the art from the following detailed description of a preferred embodiment thereof, taken with the accompanying drawings, in which:

FIG. 1 is a perspective view of the simulator showing internal elements and with the vertical polarization components highlighted;

FIGS. 1A and 1B show alternative terminations for the conducting arrays;

DESCRIPTION OF THE PREFERRED EMBODIMENTS

Figure 1C:
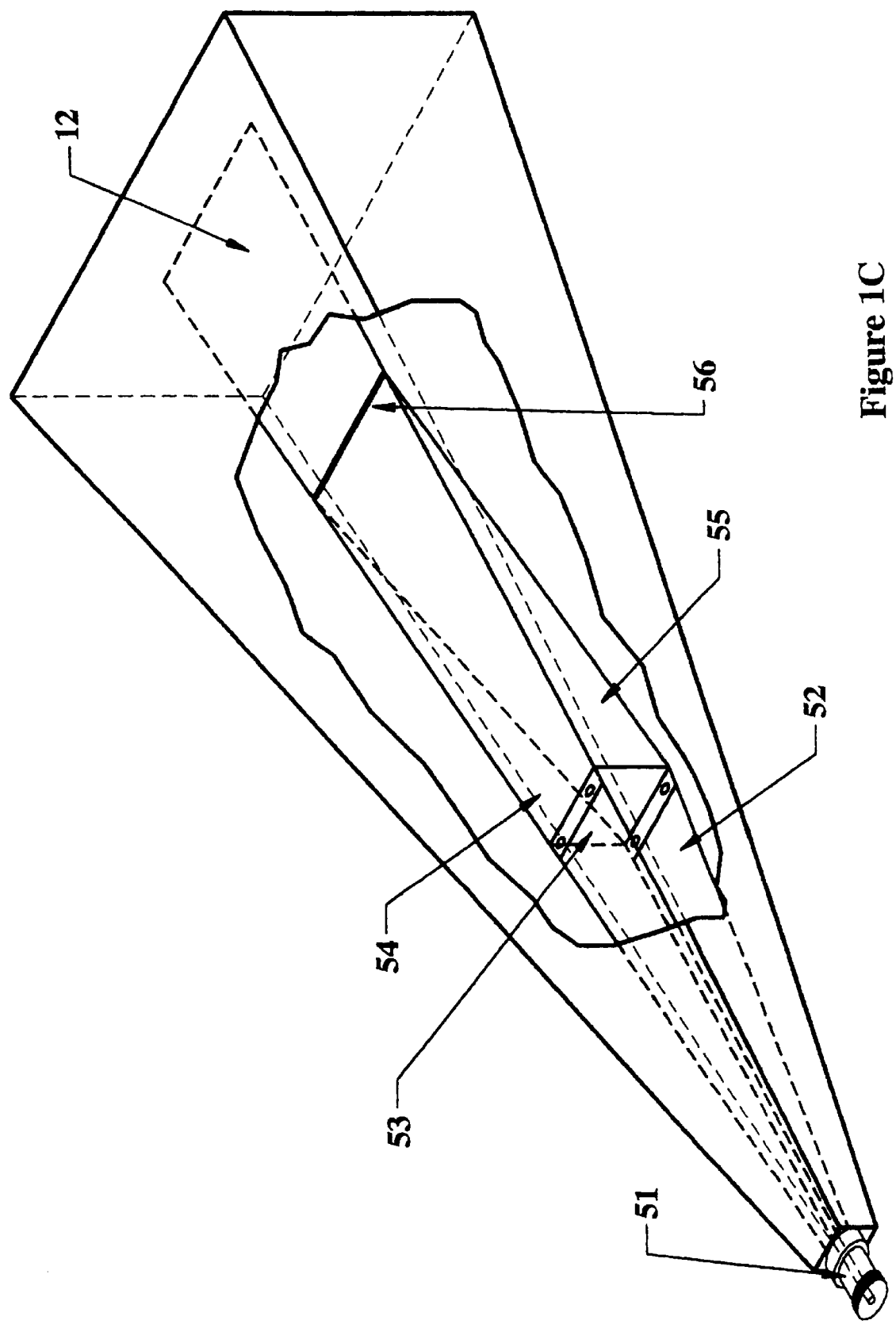
FIG. 1C shows details of the feed to the horn antenna used in the simulator of FIG. 1.

FIG. 1 shows a semi-anechoic dual polarization simulator providing radiation of both vertical and horizontal polarization in the test area. This permits simulation of the typical electromagnetic environment that is encountered by objects located very close to the ground. The simulator also permits fast measurements of electromagnetic susceptibility and radiation in both polarizations. The need for rotating the measuring antenna or placing the tested object in different orientations, imposed by existing measuring techniques, is eliminated.

The drawing of FIG. 1 shows the components relating to the vertical polarization highlighted. The simulator is based on a hybrid concept, consisting of a TEM-mode rectangular horn antenna 10 and a TEM-mode parallel transmission line 11. The radiation is supplied to an enclosure 20 having non-reflecting material 21 on the side walls, end walls 23, 24 and ceiling but a conducting floor 22. A door 25 is provided to the enclosure. Antenna 10 contains a conducting septum 12 that is located above the geometrical center of the horn. At the mouth of the horn the septum is connected to a parallel transmission line formed by individual wires or very thin pipes 13. The transmission line is connected to a single termination point via terminating resistor 14. The resistor 14 can either be connected to a metallic wall opposite to the mouth of the vertical polarization horn as shown or to the ceiling of the semi-anechoic chamber as in FIG. 2. The terminating resistor can be positioned inside or outside the semi-anechoic chamber (see FIGS. 1A and 1B). The advantage of having the connection to the terminating resistor outside the chamber is the ability to change instantaneously the level of testing power.

Figure 2:
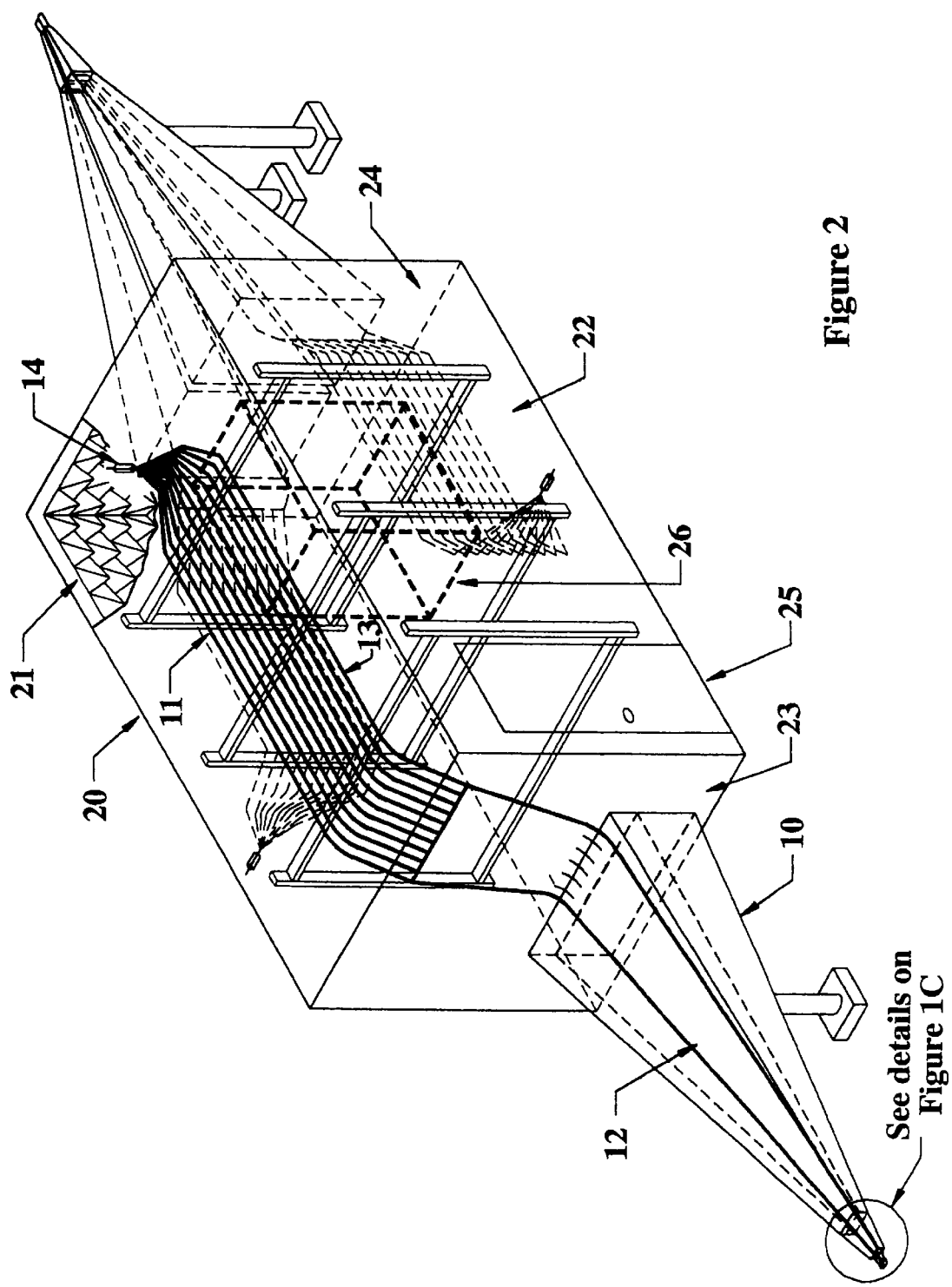
FIG. 2 shows a perspective view of the simulator similar to that of FIG. 1 with different terminations for the conducting arrays.

FIG. 1C shows detail of the structure matching the feed from the coaxial input line to the rectangular geometry of horn 10. A conventional coaxial connector 51 has its central pin connected to a conducting member 52, centrally located in the horn structure. Member 52 is of square cross-section with walls expanding outwardly, parallel to the horn. Member 52 may be solid or hollow, although hollow is preferred since the reduced weight simplifies construction. Member 52 terminates at a plane 53 (which may be a conducting plane or an aperture) from which two flat conducting plates 54, 55 extend forwardly from the upper and lower edges of plane 53, respectively. Plates 54 and 55 intersect to define an edge 56 which is attached to the start of septum 12. As shown, septum 12 is located off-center in the horn.

This structure results in a uniform impedance transition at high frequencies, without reflections, from a circular coaxial geometry to a parallel plate, off-center, transmission line.

The simulator operates as follows—the parallel transmission line provides a uniform TEM-mode electromagnetic field in the testing volume 26 at frequencies extending from DC to a frequency where the height of the transmission line above the ground is equal half a wavelength. Above this frequency, as a result of over-moding and attenuation, the field intensity provided by the parallel transmission line decreases—therefore, the electromagnetic field has to be provided by the horn antenna. The design of the horn antenna is such that the horn starts operating and irradiating the testing volume 26 at frequencies where the height of the transmission line above the ground is greater than half a wavelength. The upper frequency limit of the simulator is dictated by the maximum frequency of operation of the horn antenna and is governed by the size of the horn TEM-mode feed and the flare angle of the horn.

Figure 3:
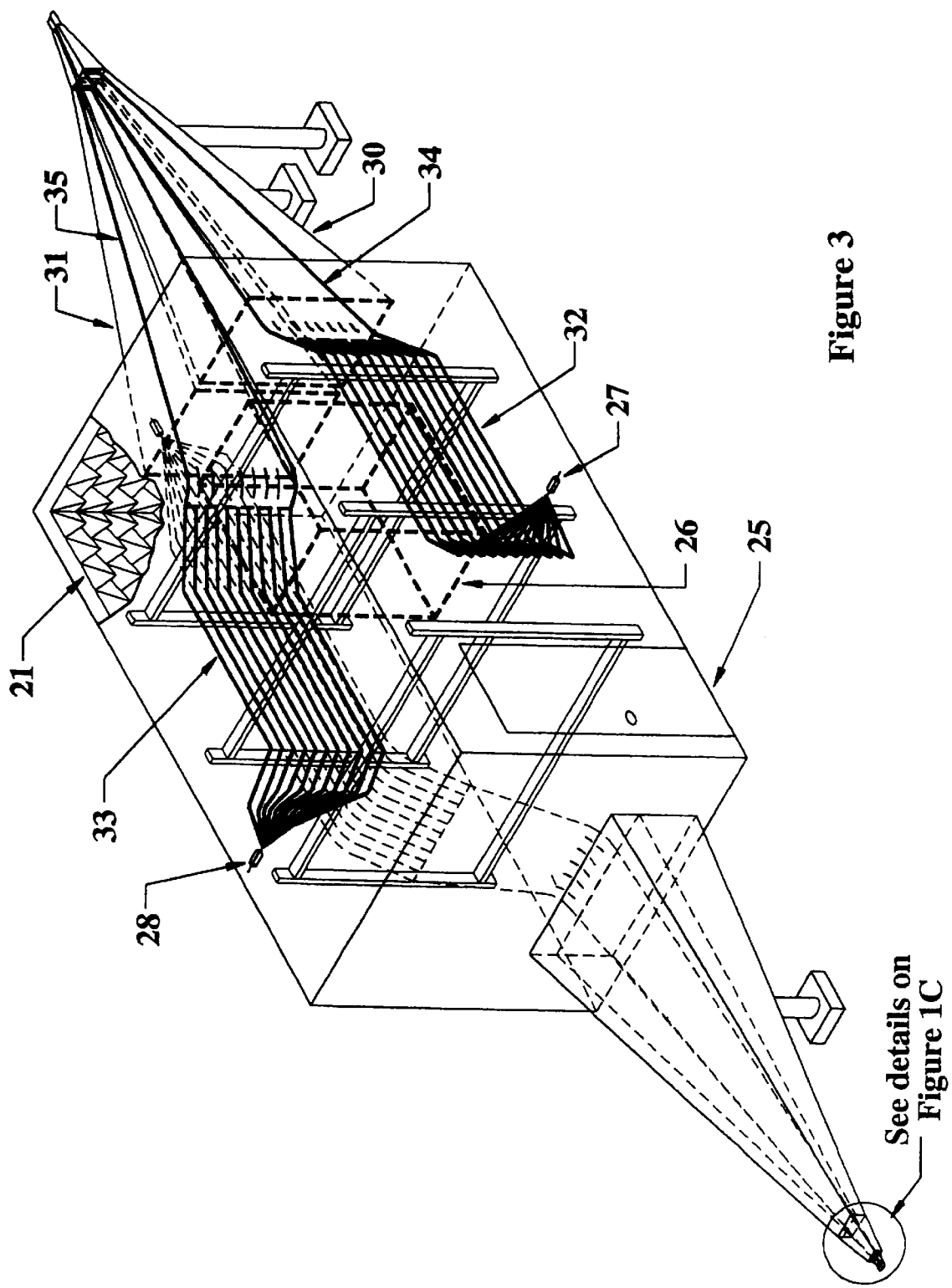
FIG. 3 shows a perspective view similar to FIG. 1 but with the horizontal polarization components highlighted.

The drawing of FIG. 3 shows the same simulator with the components relating to horizontal polarization highlighted. Again the simulator is based on a hybrid concept, consisting of two TEM-mode rectangular horn antennas 30, 31 and two TEM-mode parallel transmission lines 32, 33. The antennas contain conducting septums 34, 35 that are located outside the geometrical centers of the horns. The septums, upon leaving the horns, are connected to parallel transmission lines 32, 33 formed out by individual wires or very thin pipes. The other sides of the transmission lines are connected to single termination points via terminating resistors 27, 28. The resistors can either be connected to a metallic wall opposite to the mouth of the horizontal polarization horns or to the side walls of the semi-anechoic chamber. The terminating resistors can be positioned inside or outside the semi-anechoic chamber. The advantage of connecting the terminating resistors outside the chamber is the ability to change instantaneously the level of testing power.

The simulator operates as follows—the parallel transmission lines provide a uniform TEM-mode electromagnetic field in the testing volume 26 at frequencies extending from DC to a frequency where the distance between the transmission lines is equal to a wavelength. Above this frequency, as a result of over-moding and attenuation, the field intensity provided by the parallel transmission lines decreases—therefore, the electromagnetic field has to be provided by the horn antennas. The design of the horn antennas is such that each horn starts operating and irradiating the testing volume at frequencies where the distance between the transmission lines is equal to a wavelength. The upper frequency limit of the simulator is dictated by the maximum frequency of operation of each horn antenna and is governed by the size of each horn TEM-mode feed and the flare angle of each horn.

Figure 4:
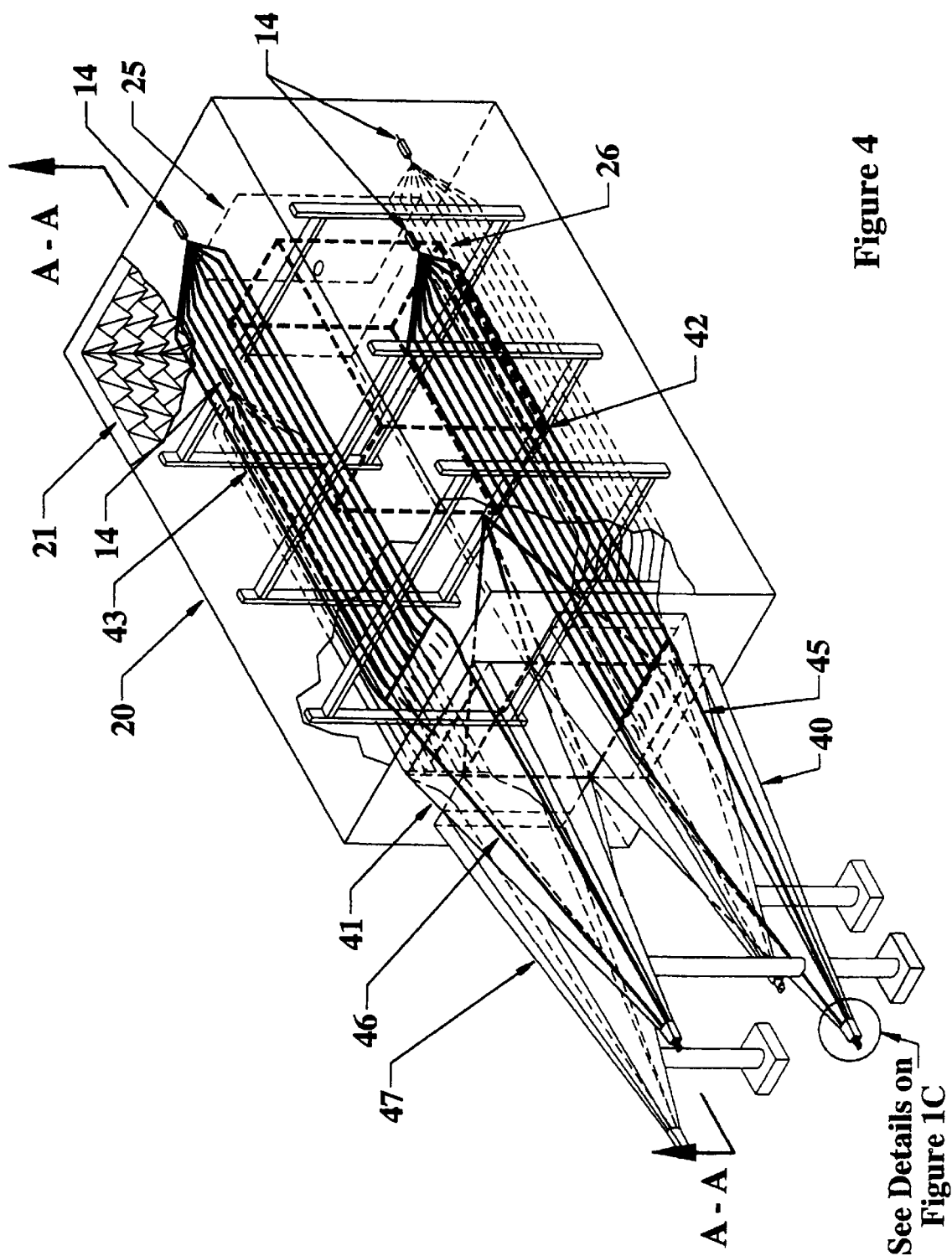
FIG. 4 shows a perspective view of another embodiment of the simulator with the vertical polarization components highlighted.
Figure 10:
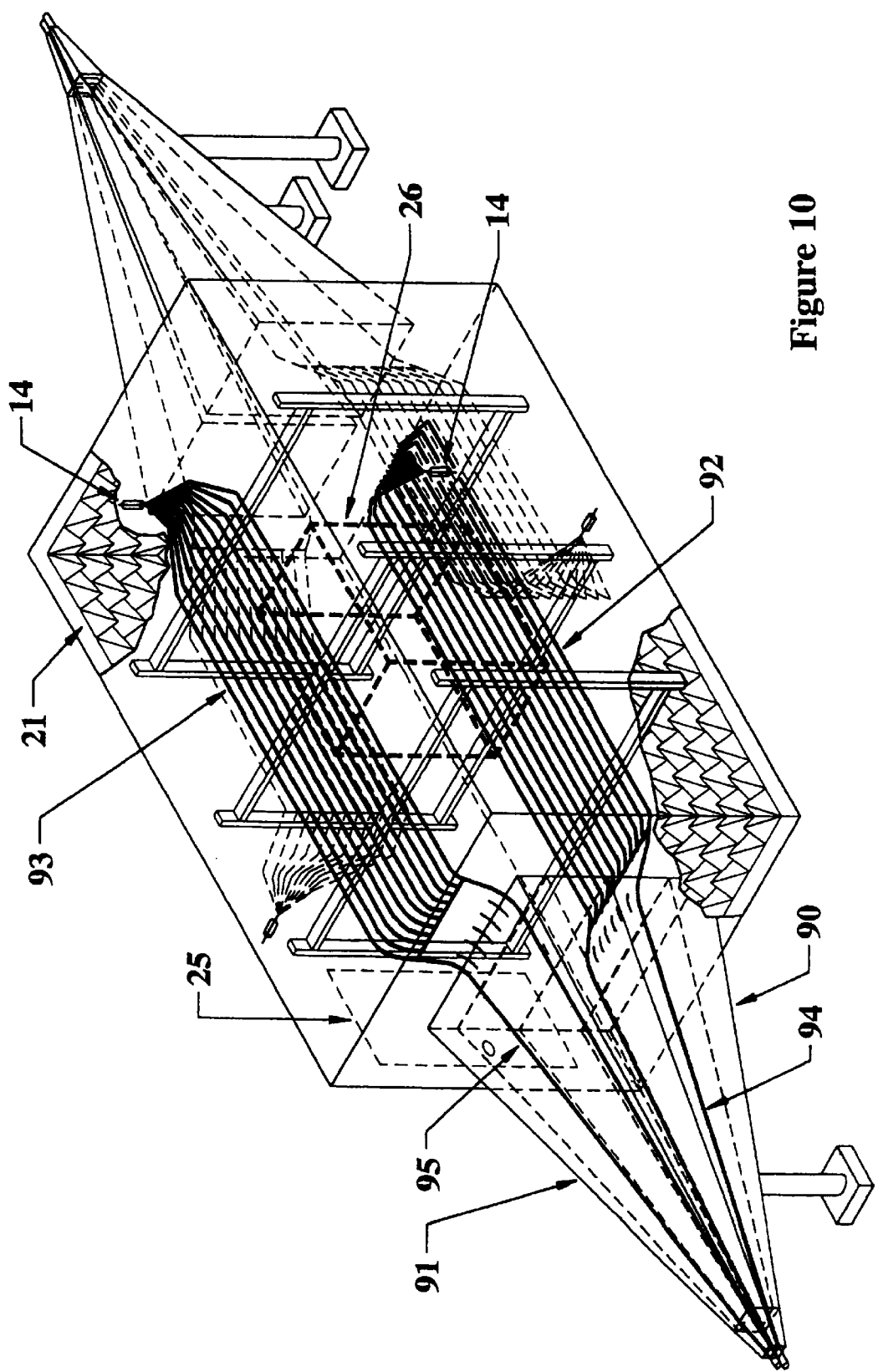
FIG. 10 is a perspective view similar to FIG. 9 but with different terminations for the conducting arrays.

FIG. 4 shows a modified simulator based on the horizontal polarization simulator shown in FIG. 10 of U.S. Pat. No. 5,440,316. The simulator of FIG. 4 is modified by the addition of a second set of two antennas rotated by 90 degrees in respect to the first set of two antennas to develop an anechoic dual polarization simulator shown in FIG. 4. The chamber has an anechoic lining 21 on all walls, floor and ceiling.

The anechoic chamber simulator allows simulation of the typical electromagnetic environment that is encountered by objects located very high above the ground; such as an aircraft in flight. The simulator permits fast measurements of electromagnetic susceptibility and radiation in both polarizations. The need for rotating the measuring antenna or placing the tested object in different orientation, imposed by existing measuring techniques, is eliminated. The dual polarization simulator can be incorporated into an is anechoic chamber in two possible configurations shown in FIGS. 4 to 8 and FIGS. 9 to 12.

In the configuration of FIGS. 4 to 8 each pair of horn antennas (for both polarizations) is located on the same wall of the chamber, permitting large objects to be tested to be introduced through the opposite wall.

Figure 5:
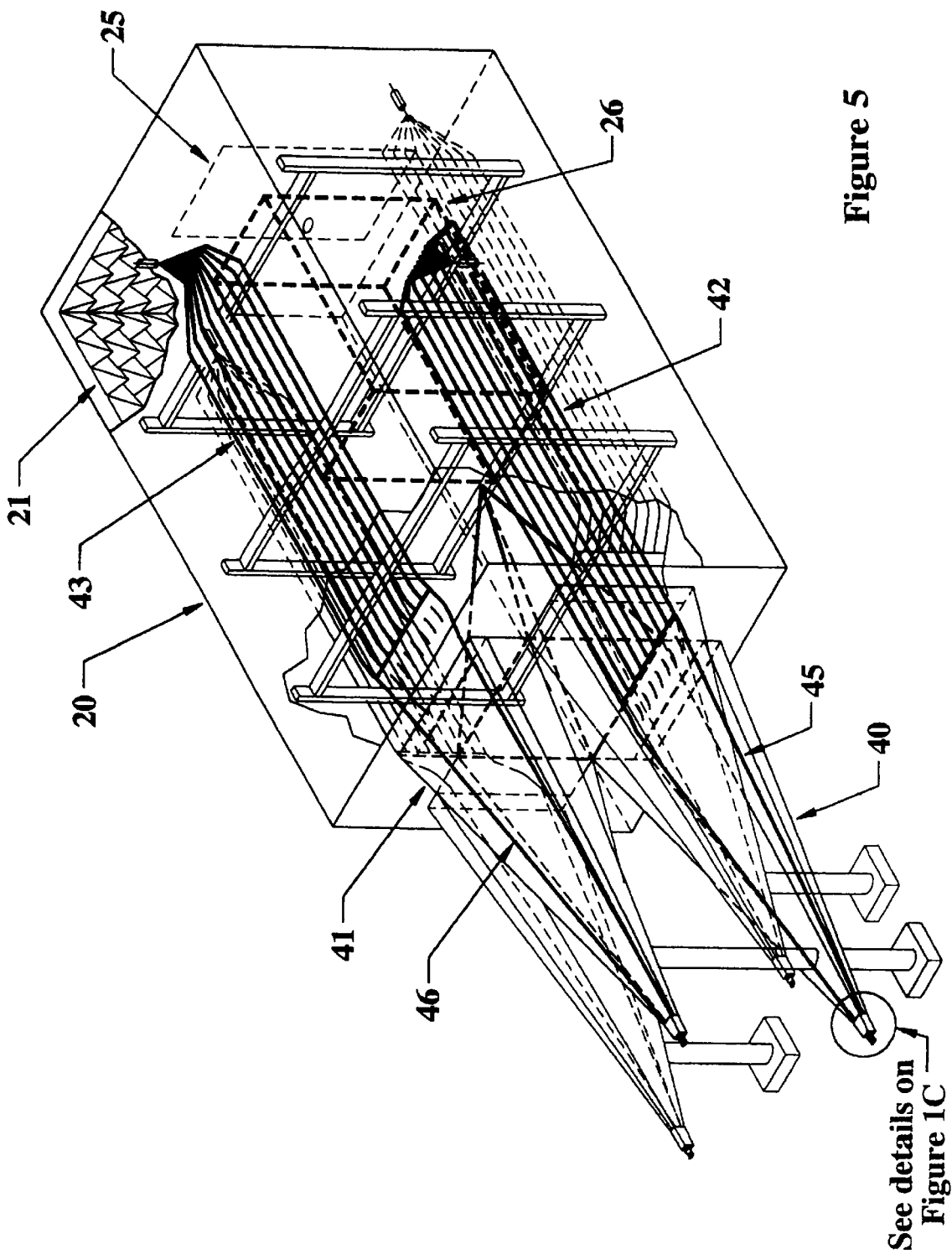
FIG. 5 shows a perspective view of the simulator similar to FIG. 4 but with different terminations for the conducting arrays.

FIGS. 4 and 5 show the simulator with the components relating to vertical polarization highlighted. Two TEM-mode rectangular horn antennas 40, 41 and two TEM-mode parallel transmission lines 42, 43 are employed. The antennas contain conducting septums 45, 46 that are located outside geometrical centers of the horns. At the mouths of the horns the septums are connected to the parallel transmission lines formed out by individual wires or very thin pipes. The other side of the transmission lines are connected to single termination points via terminating resistors 14. The resistors can either be connected to a metallic wall opposite to the mouth of the vertical polarization horns (see FIG. 4) or to the ceiling and floor of the anechoic chamber (see FIG. 5). The terminating resistors 14 can be positioned inside or outside the anechoic chamber as discussed in connection with FIGS. 1A and 1B. The advantage of connecting the terminating resistors outside the chamber is the ability to change instantaneously the level of testing power used.

Figure 6:
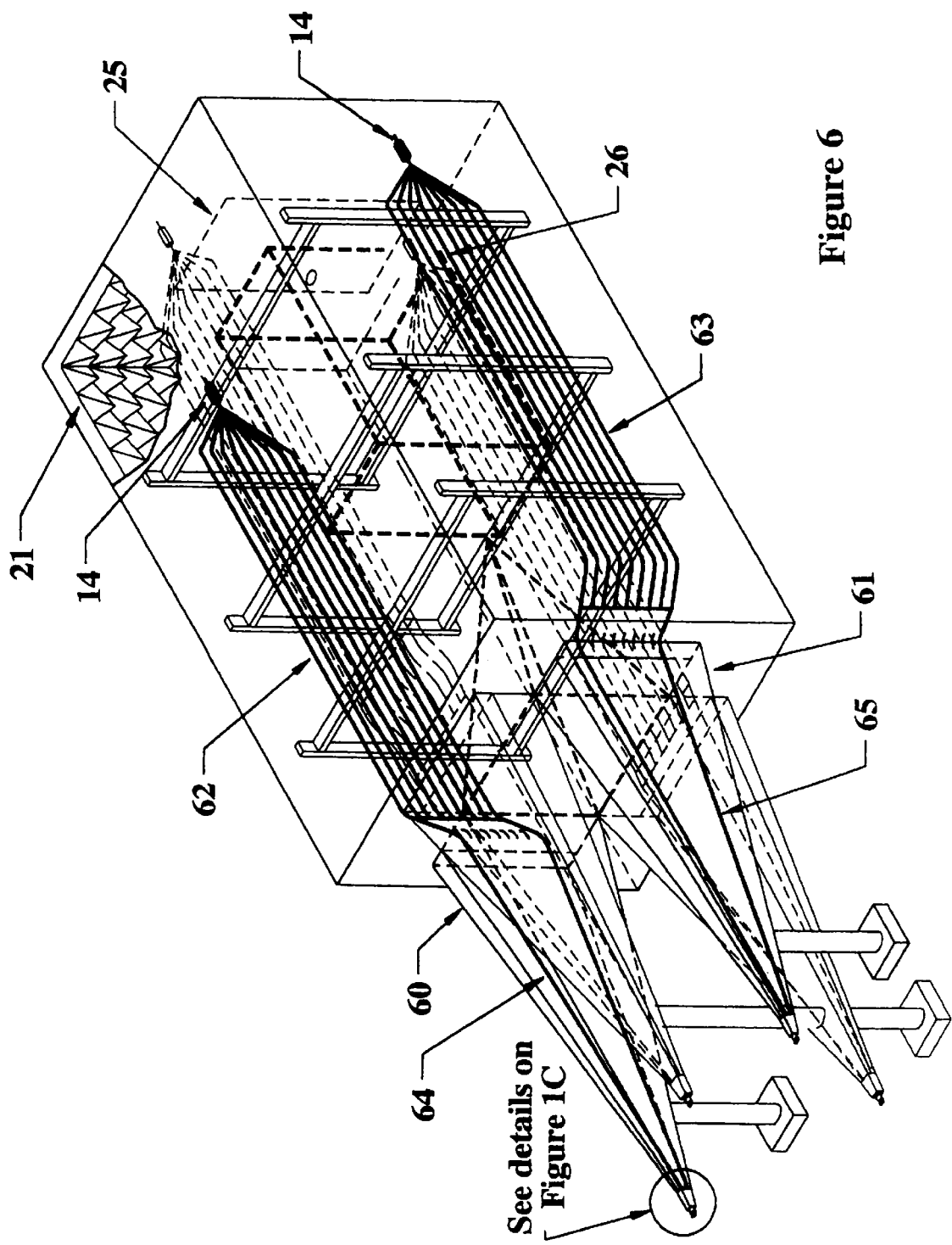
FIG. 6 shows a perspective view of the simulator similar to FIG. 4 but with the horizontal polarization components highlighted.
Figure 7:
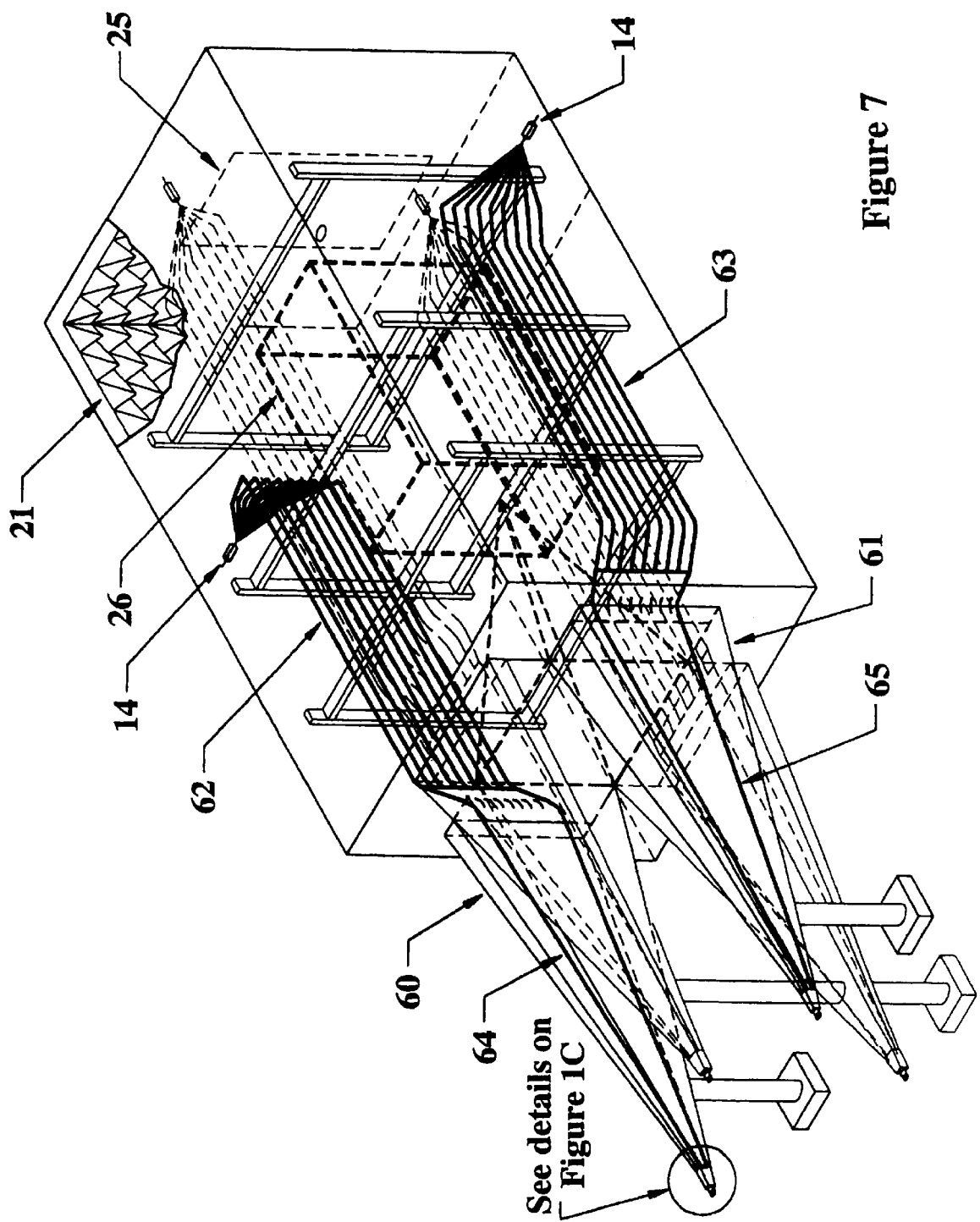
FIG. 7 shows a perspective view of the simulator similar to FIG. 6 but with different terminations for the conducting arrays.

FIGS. 6 and 7 show the simulator with components relating to horizontal polarization highlighted. Two TEM-mode rectangular horn antennas 60, 61 and two TEM-mode parallel transmission lines 62, 63 are employed. The antennas contain conducting septums 64, 65 that are located outside the geometrical centers of the horns. The septums, upon leaving the horns, are connected to the parallel transmission lines formed out by individual wires or very thin pipes. The other sides of the transmission lines are connected to a single termination point via terminating resistors 14. The resistors can either be connected to a metallic wall opposite to the mouth of the horizontal polarization horns or to the side walls of the anechoic chamber (see FIG. 7). The terminating resistors can be positioned inside or outside the anechoic chamber as discussed in connection with FIG. 1. The advantage of connecting the terminating resistors outside the chamber is the ability to change instantaneously the level of testing power.

The simulator operates as follows—the parallel transmission lines 42, 43 and 62, 63 provide a uniform TEM-mode electromagnetic fields in the testing volume at frequencies extending from DC to a frequency where the distance between the transmission lines is equal to a wavelength. Above this frequency, as a result of over-moding and attenuation, the field intensity provided by the parallel transmission lines decreases—therefore, the electromagnetic field has to be provided by the horn antennas. The design of the horn antennas is such that each horn starts operating and irradiating the testing volume at frequencies where the distance between the transmission lines is equal to a wavelength. The upper frequency limit of the simulator is dictated by the maximum frequency of operation of each horn antenna and is governed by the size of each horn TEM-mode feed and the flare angle of each horn.

Figure 8:
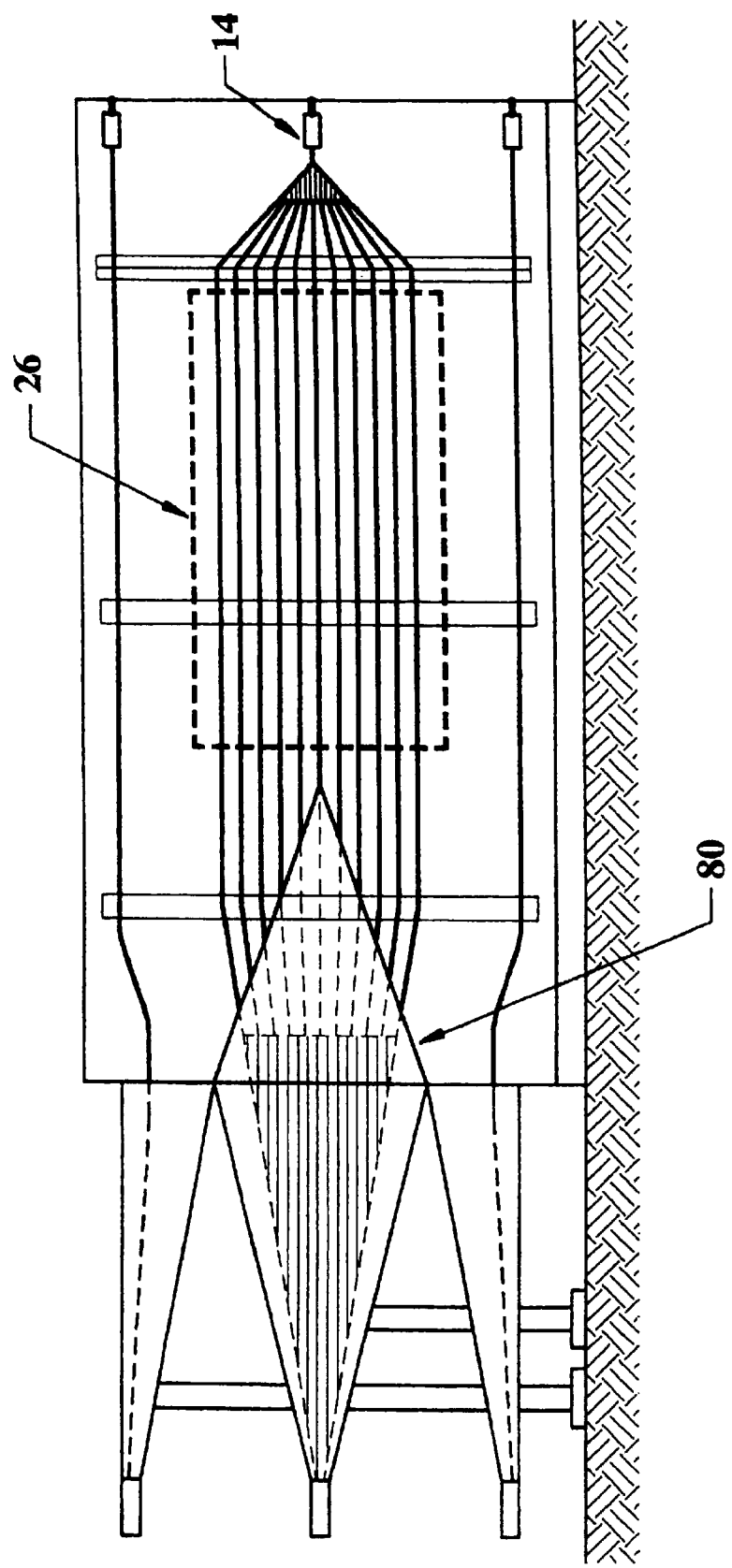
FIG. 8 is a view taken along the line A—A of FIG. 4.

FIG. 8 shows a section along the line A—A of FIG. 4, illustrating a pyramidal metallic structure 80 located at the wall containing the horn antennas. This structure assures field uniformity between the two pairs of horns providing the horizontal and vertical polarization fields.

FIGS. 9 to 12 illustrate a further embodiment of the simulator in which the pair of horn antennas for vertical polarization and the pair of horn antennas for horizontal polarizations are located on opposite walls of the chamber. Such a configuration provides greater electromagnetic field uniformity than the embodiment of FIGS. 5 to 8, however, it restricts the testing volume 26 and restricts the location of any access door.

Figure 9:
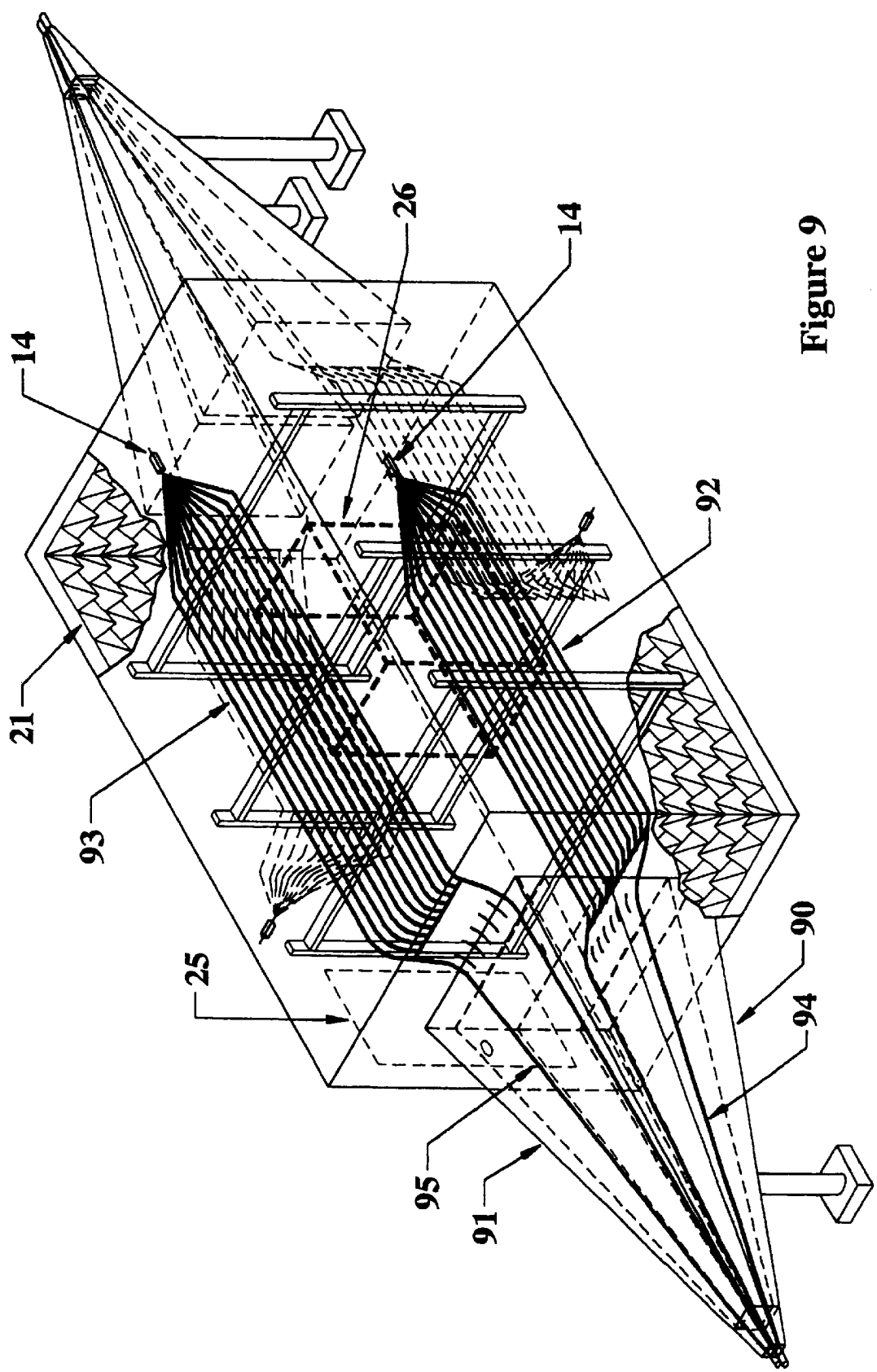
FIG. 9 is a perspective view of another embodiment of the simulator with vertical polarization components highlighted.

In FIGS. 9 and 10 the components relating to vertical polarization are shown highlighted. Two TEM-mode rectangular horn antennas 90, 91 and two TEM-mode parallel transmission lines 92, 93 are used. The antennas contain conducting septums 94, 95 that are located outside the geometrical centers of the horns. At the mouths of the horns the septums are connected to the parallel transmission lines formed out by individual wires or very thin pipes. The transmission lines are connected to single termination points via terminating resistors 14. The resistors can either be connected to a metallic wall opposite to the mouth of the vertical polarization horns (see FIG. 9) or to the ceiling and floor of the anechoic chamber (see FIG. 10). The terminating resistors can be positioned inside or outside the anechoic chamber. The advantage of connecting the terminating resistors outside the chamber is the ability to change instantaneously the level of the testing power.

Figure 11:
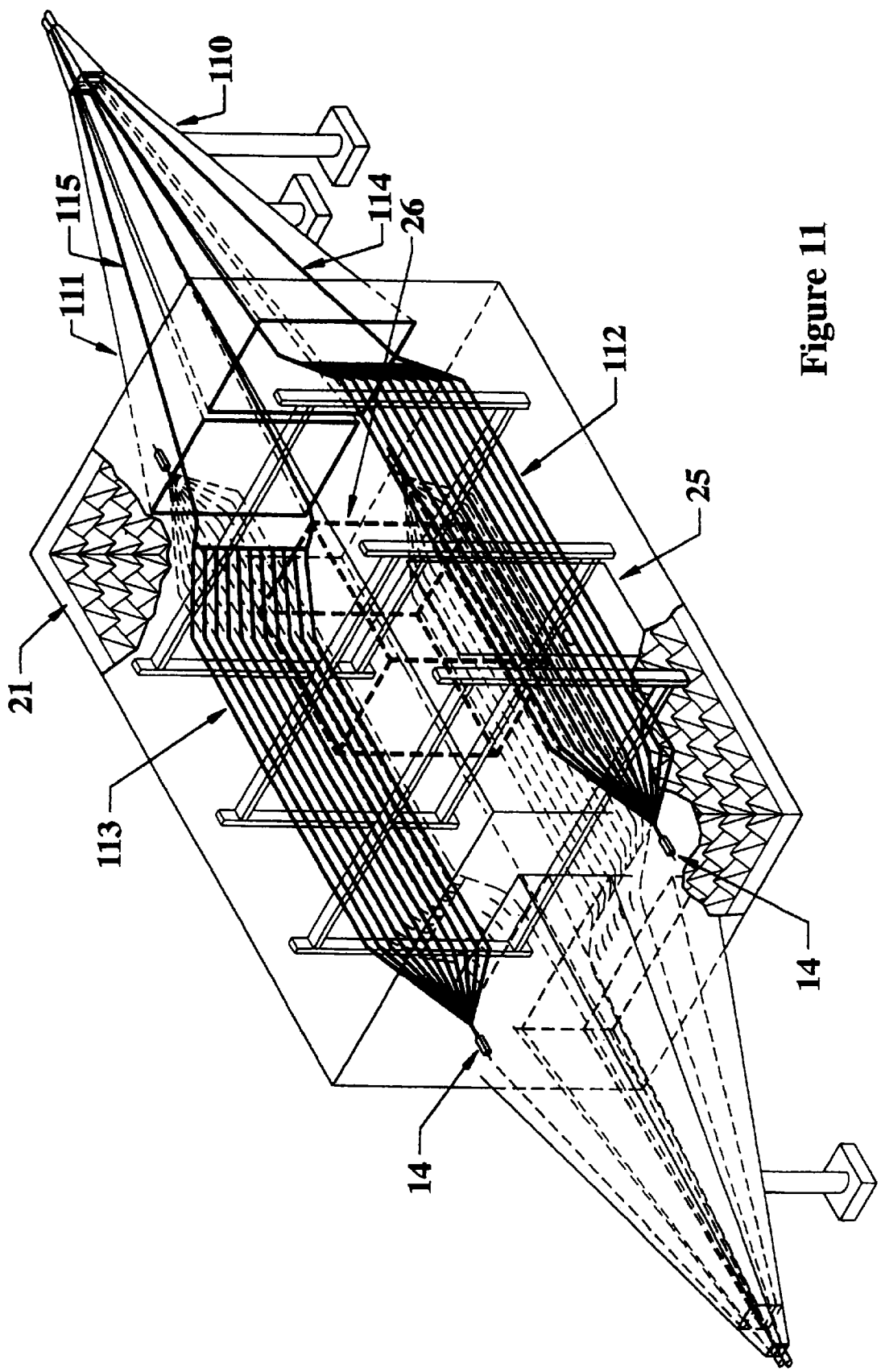
FIG. 11 is a perspective view similar to FIG. 9 with the horizontal polarization components highlighted.
Figure 12:
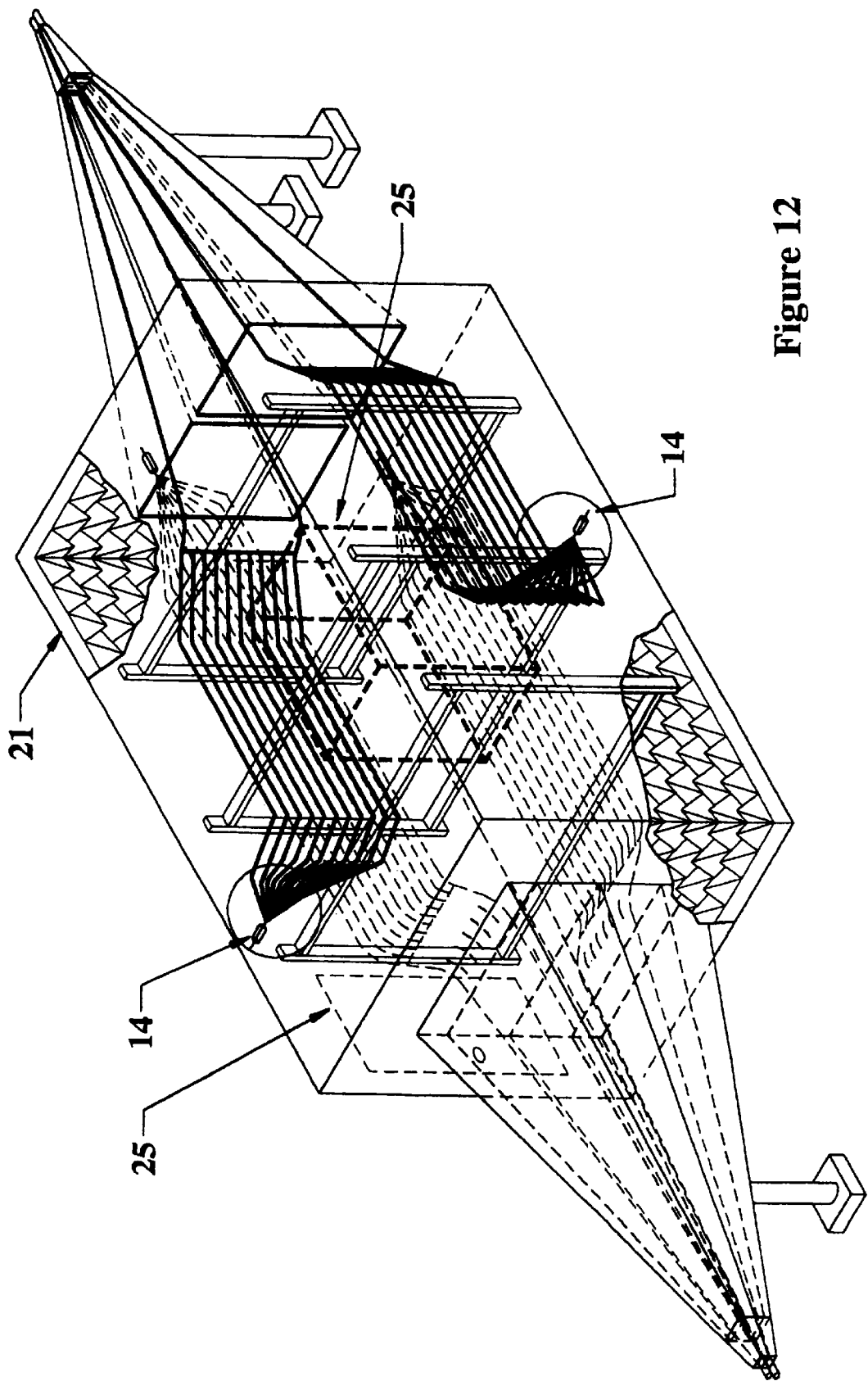
FIG. 12 is a perspective view similar to FIG. 11 but with different terminations for the conducting arrays.

FIGS. 11 and 12 show the simulator with the components relating to the horizontal polarization highlighted. Two TEM-mode rectangular horn antennas 110, 111 and two TEM-mode parallel transmission lines 112, 113 are provided. The antennas contain conducting septums 114, 115 that are located outside the geometrical centers of the horns. The septums, upon leaving the horns, are connected to the parallel transmission lines formed out by individual wires or very thin pipes. The other sides of the transmission lines are connected to a single termination point via terminating resistors. The resistors can either be connected to a metallic wall opposite to the mouth of the horizontal polarization horns or to the side walls of the anechoic chamber. The terminating resistors can be positioned inside or outside the anechoic chamber. The advantage of connecting the terminating resistors outside the chamber is the ability to change instantaneously the level of the testing power.

The simulator operates as follows—the parallel transmission lines 92, 93 and 112, 113 provide a uniform TEM-mode electromagnetic fields in the testing volume 26 at frequencies extending from DC to a frequency where the distance between the transmission lines is equal to a wavelength. Above this frequency, as a result of over-moding and attenuation, the field intensity provided by the parallel transmission lines decreases—therefore, the electromagnetic field has to be provided by the horn antennas. The design of the horn antennas is such that each horn starts operating and irradiating the testing volume at frequencies where the distance between the transmission lines is equal to a wavelength. The upper frequency limit of the simulator is dictated by the maximum frequency of operation of each horn antenna and is governed by the size of each horn TEM-mode feed and the flare angle of each horn.

Figure 14:
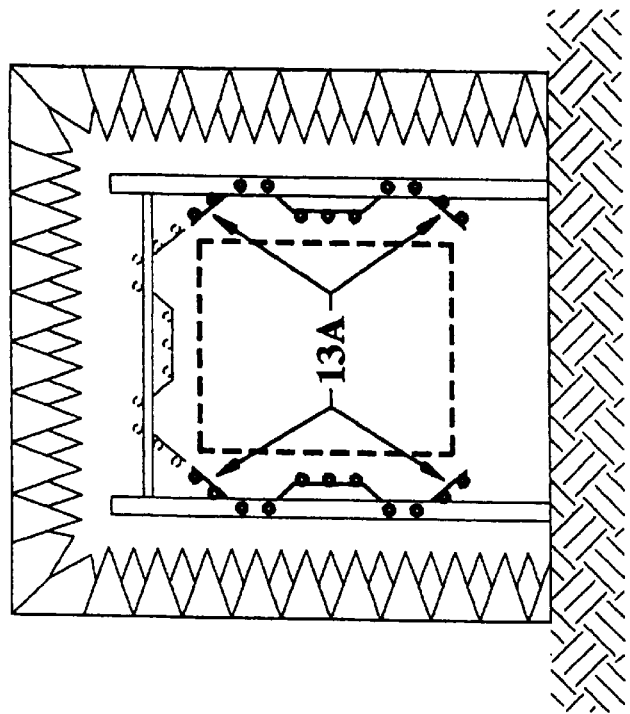
FIGS. 13 and 14 show modifications to the configuration of the transmission lines used to define the test area.
Figure 13:
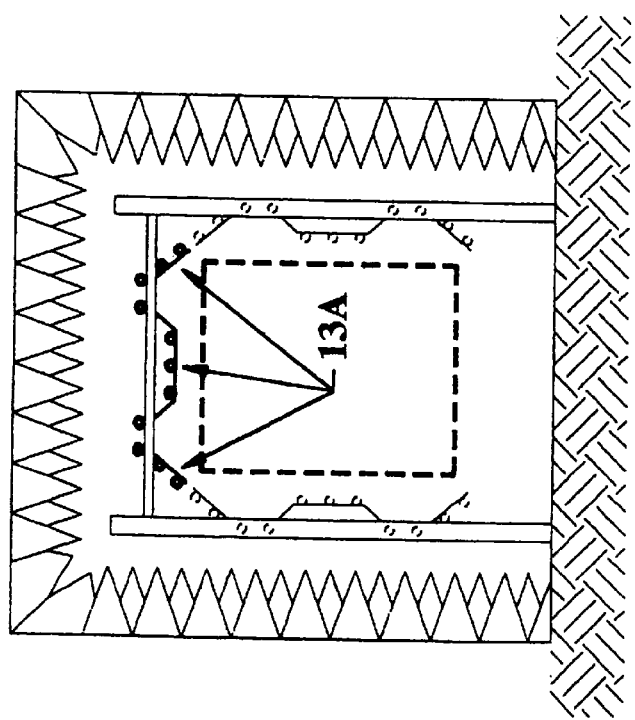

The simulators hitherto described in this application have employed transmission lines formed by conductors 13 which are planar in the region of the test area 26. In order to maximize field uniformity in the test area at low frequencies, the configuration of the individual wires and thin pipes can be changed from planar to a configuration which provides the largest uniform field cross-section of the test area. A typical arrangement is shown in FIG. 13 for the transmission line providing vertical polarization and in FIG. 14 for the transmission lines providing horizontal polarization. As shown, some of the conductors 13A are displaced from the planar arrangement to provide the optimum uniform field in the test area.

Figure 15:
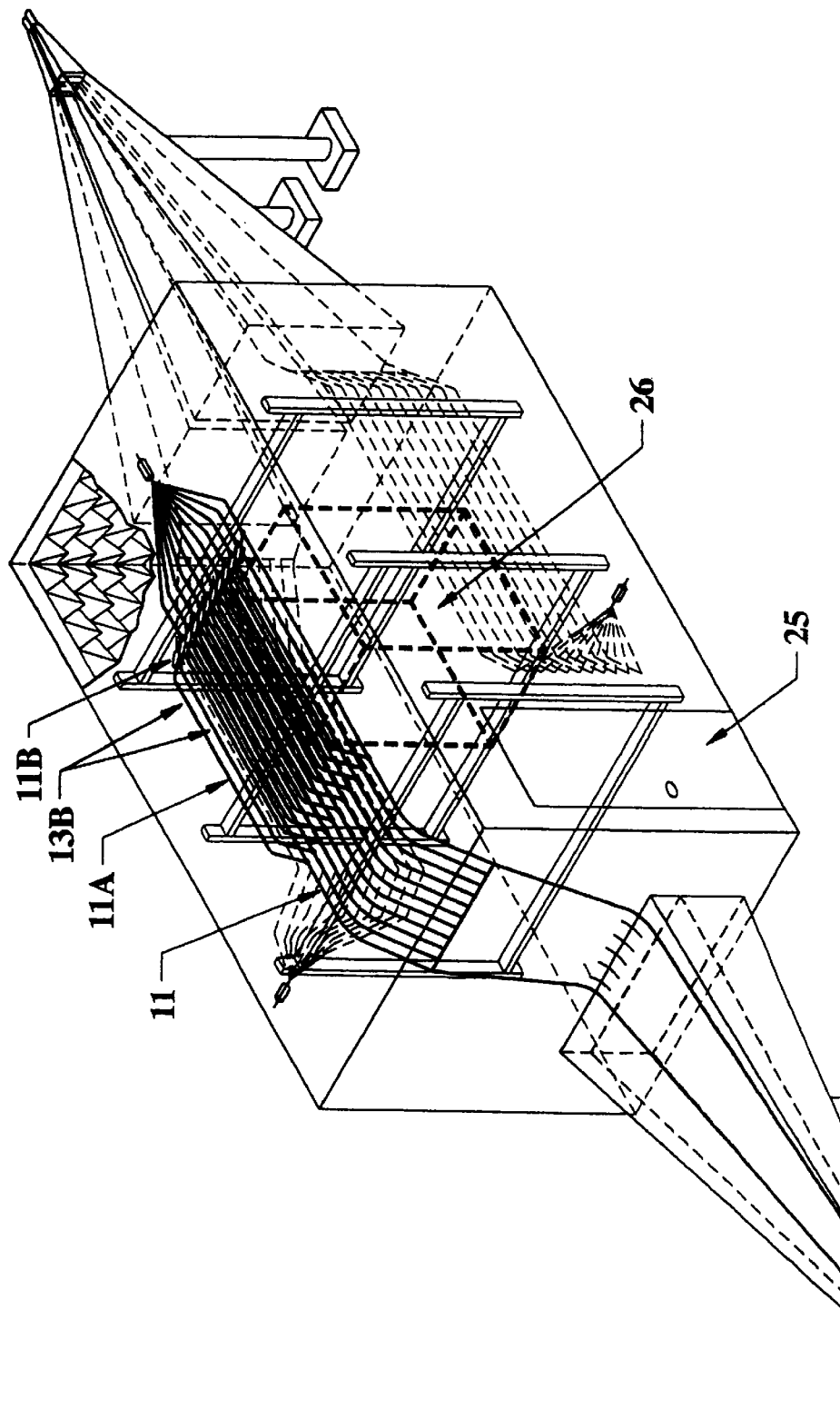
FIG. 15 shows the simulator of FIG. 1 with a further modified transmission line.

To improve further the field uniformity at low frequencies, transmission line 11 can be formed with a parallel segment 11A as shown in FIG. 15, which increases the capacitance to the enclosure and hence field uniformity at low frequencies. Segment 11A consists of an array of metallic strips 13B connected to segment 11 and placed above it. Terminating resistors 11B can be added at the ends of the metallic strips 13B to eliminate resonances from loops formed by the addition of adding segment 11A.

Figure 16:
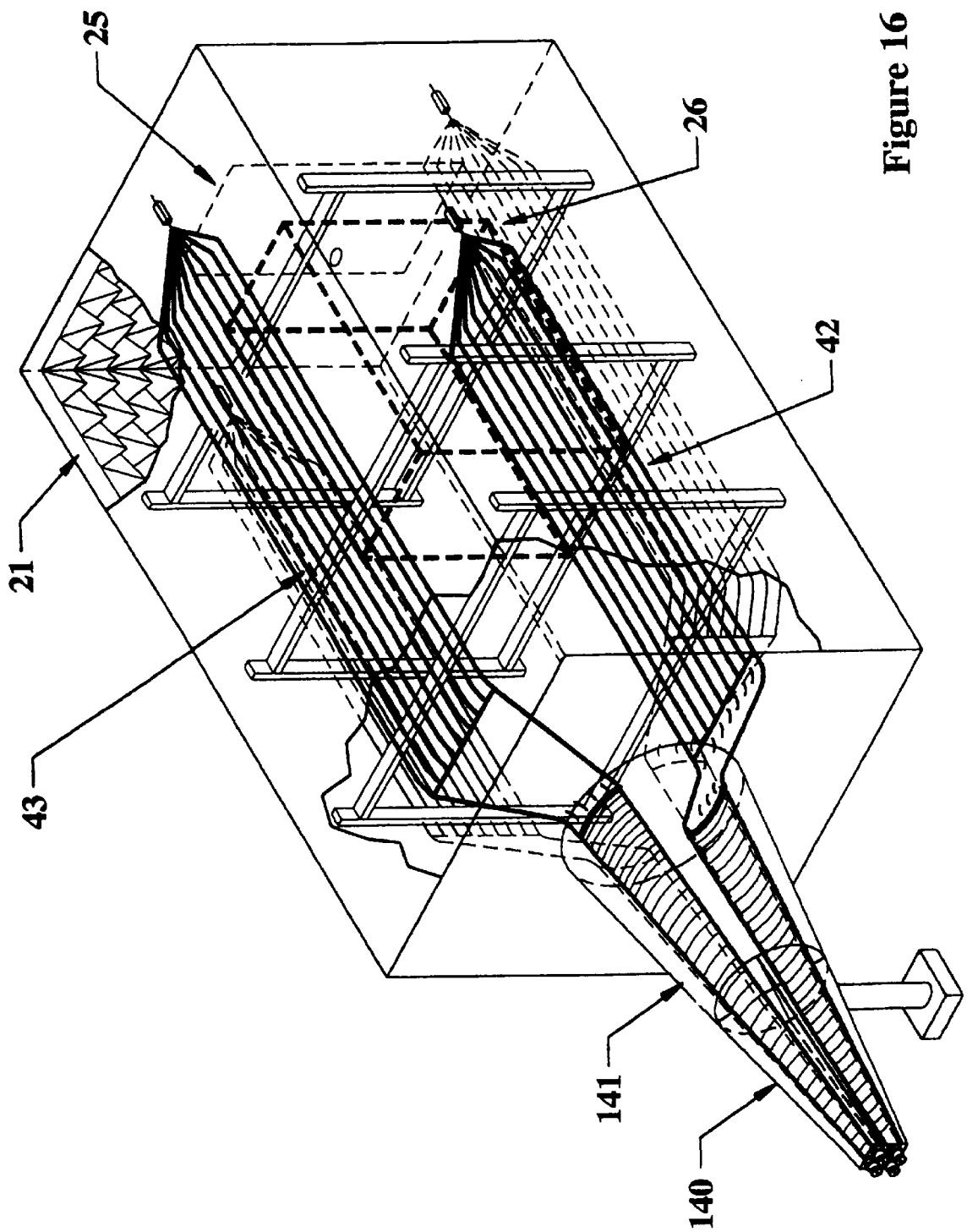
FIGS. 16 and 17 show another form of the simulator of this invention providing a circulatory polarized field in the test area.
Figure 17:
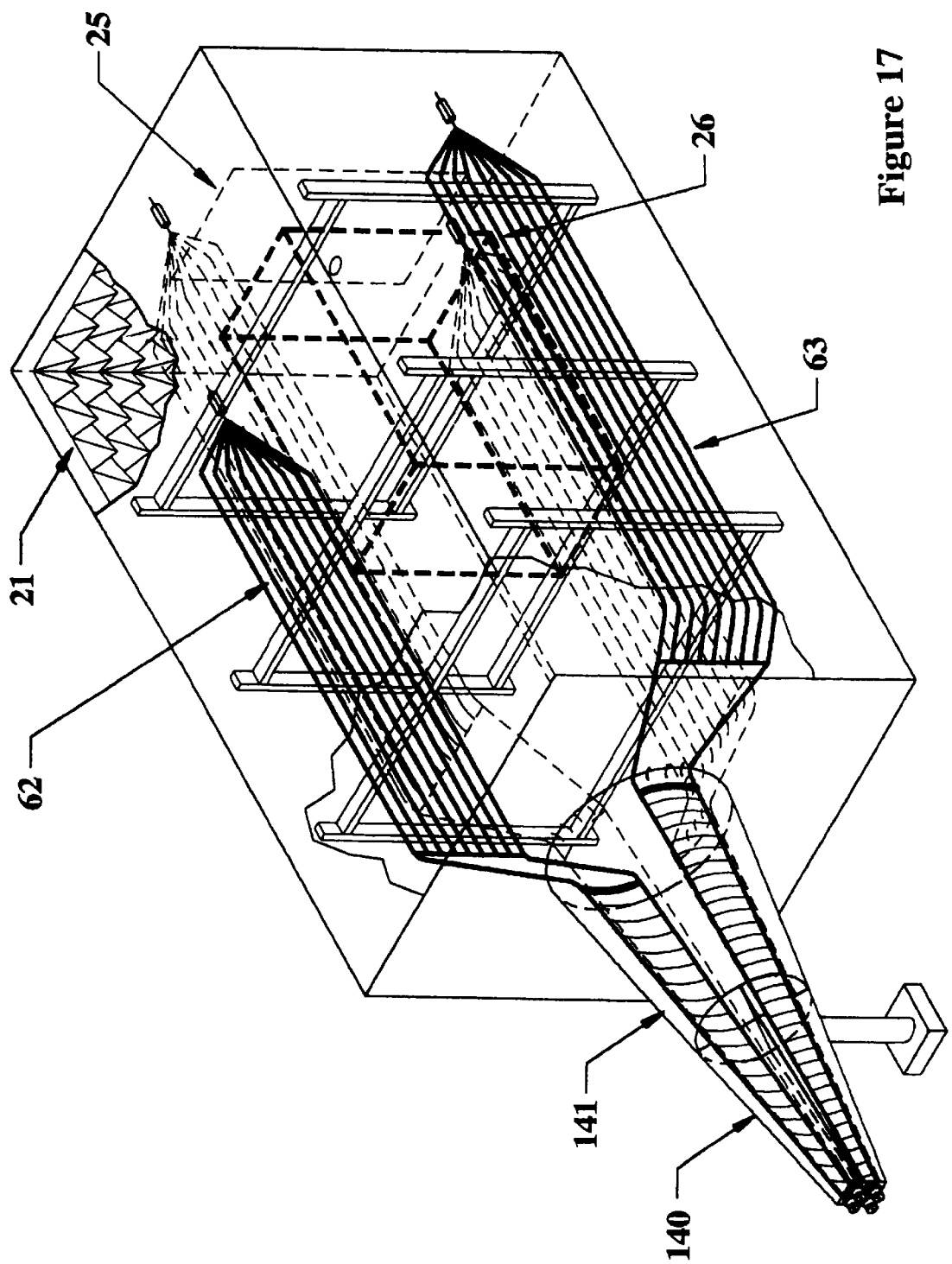

FIGS. 16 and 17 show a further embodiment of the simulator which can provide circular polarization in the test area 26. A conical horn assembly consists of a primary section 140 merging into a secondary section 141.

Section 140 is divided into four symmetrical quadrants by interior conducting walls. Within each quadrant a conducting conical sector spaced from the outer wall, and spaced from the interior conducting walls, functions as a septum. Throughout the primary section the quadrants are electrically separated from one another and a separate signal feed 143, shown in more detail in FIG. 18, is provided for each quadrant.

Section 141 functions to integrate the field components provided by the individual quadrants of section 140. On entering section 141 the septums of each quadrant continue in the same direction and with the same expansion. The dividing walls separate to become relatively shorter partitions extending inwardly around the circumference of the horn. The septums in turn are connected to simulators employing transmission lines formed by conductors 42, 43 and 62, 63 as already described in connection with FIGS. 4 and 6. The simulator can selectively provide only vertical or horizontal polarization or both simultaneously. Control of the nature of polarization provided is obtained by altering the relative phase and amplitudes of the inputs.

Figure 18:
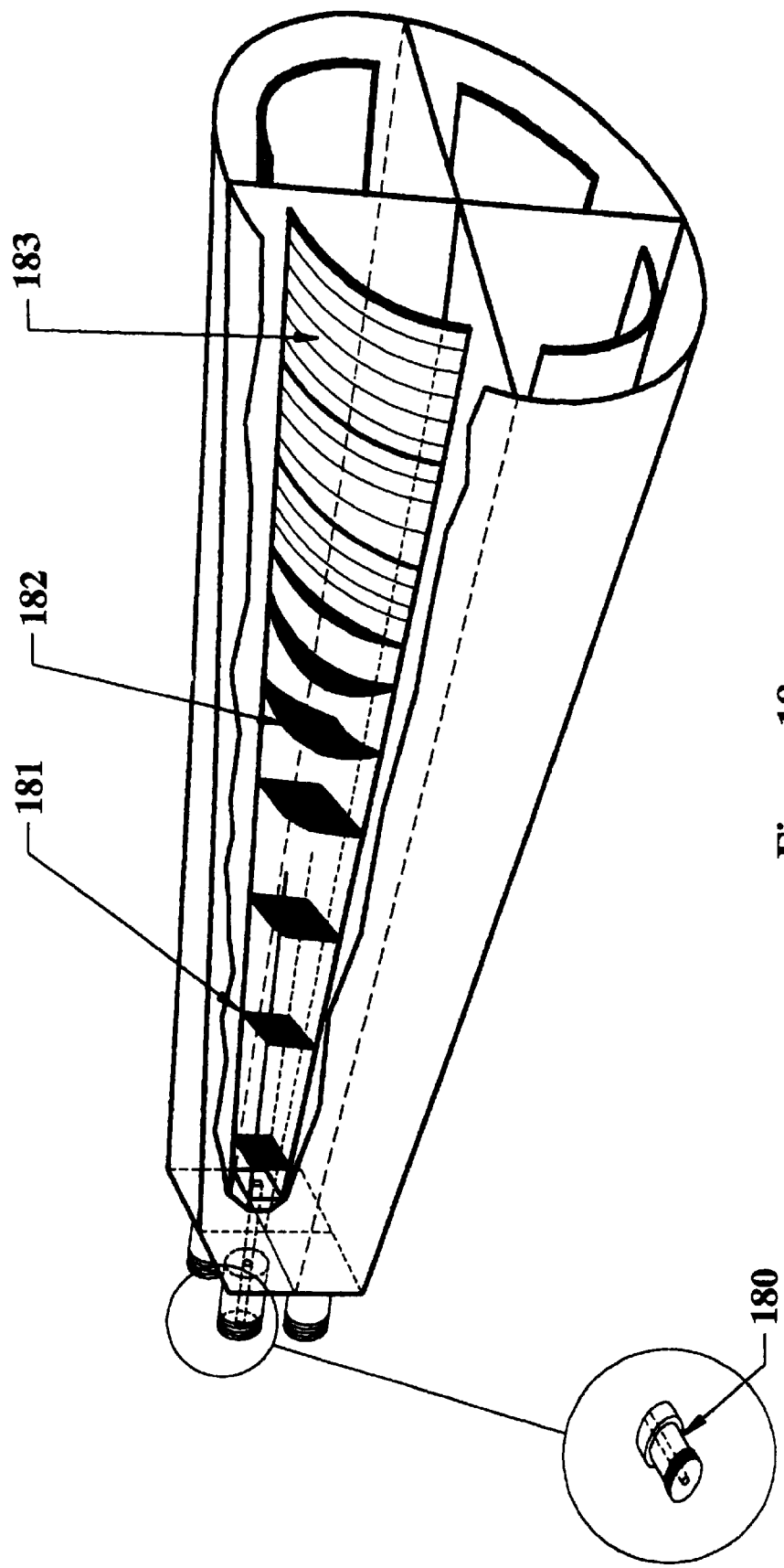
FIG. 18 shows detail of the signal feed to the simulator of FIGS. 16 and 17.

To assure broadband operation of the simulator, the input signals are supplied through coaxial lines and matched into the parallel line geometry through the horn feed system shown in FIG. 18. In FIG. 18, 180 is the coaxial input connected to transitional element 181/182/183 which changes from normal to conical geometry along its length. The round central pin of each coaxial connector is connected to elongated element 181/182/183 which has a square cross-section at its junction with the pin and changes in shape along its length through transition shapes 182 (approximately a quadrant of a cone) to merge into the septum of conical sector shape shown at 183. The various cross-sections are shown in black in FIG. 18.

Figure 19:
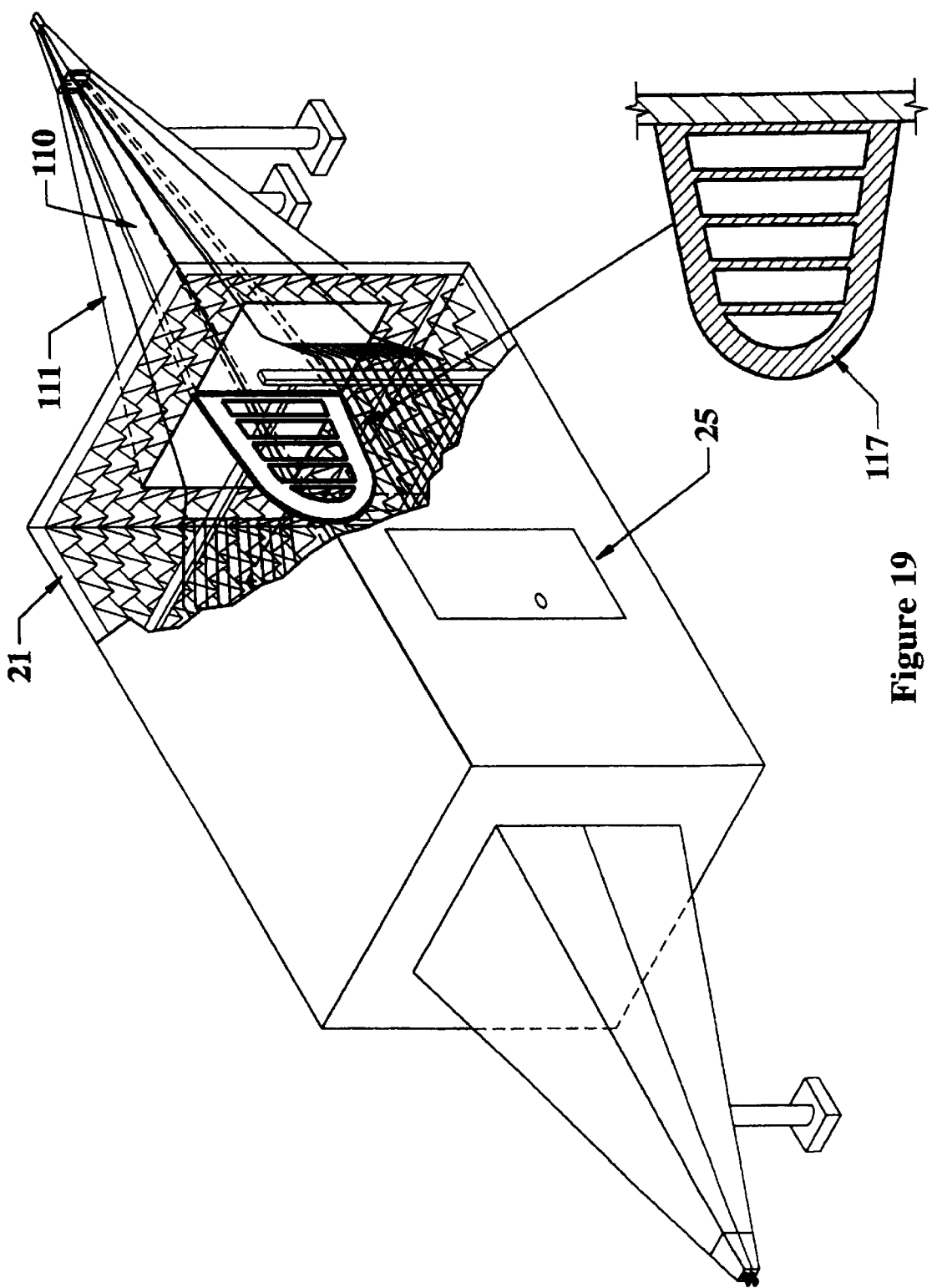
FIG. 19 shows a modification to the simulator of FIGS. 9 to 12 to produce a more uniform field.

FIG. 19 shows a simulator similar in form to that shown in FIGS. 9 to 12 but including a field modifying element 117 positioned between antennas 110 and 111. The effect of element 117 is to maintain field uniformity in the test area by removing a dip in field intensity otherwise occurring along the common plane of antennas 110 and 111. This is achieved by the induction of currents in the dipoles making up element 117, thereby covering a range of frequencies.

Figure 20:
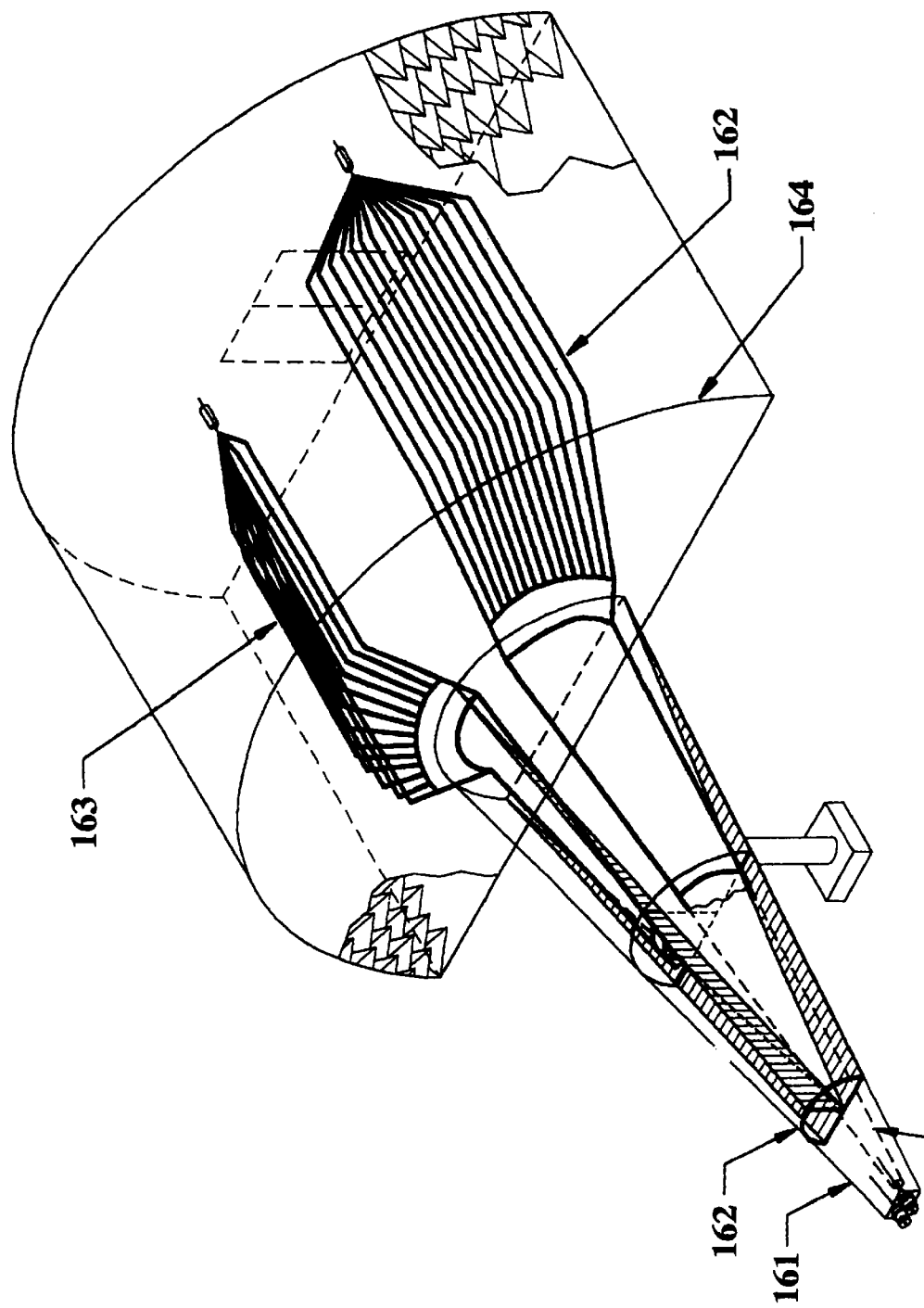
FIG. 20 shows a modification to the simulator of FIGS. 16 and 17 providing a selected angle of polarization.
Figure 20A:
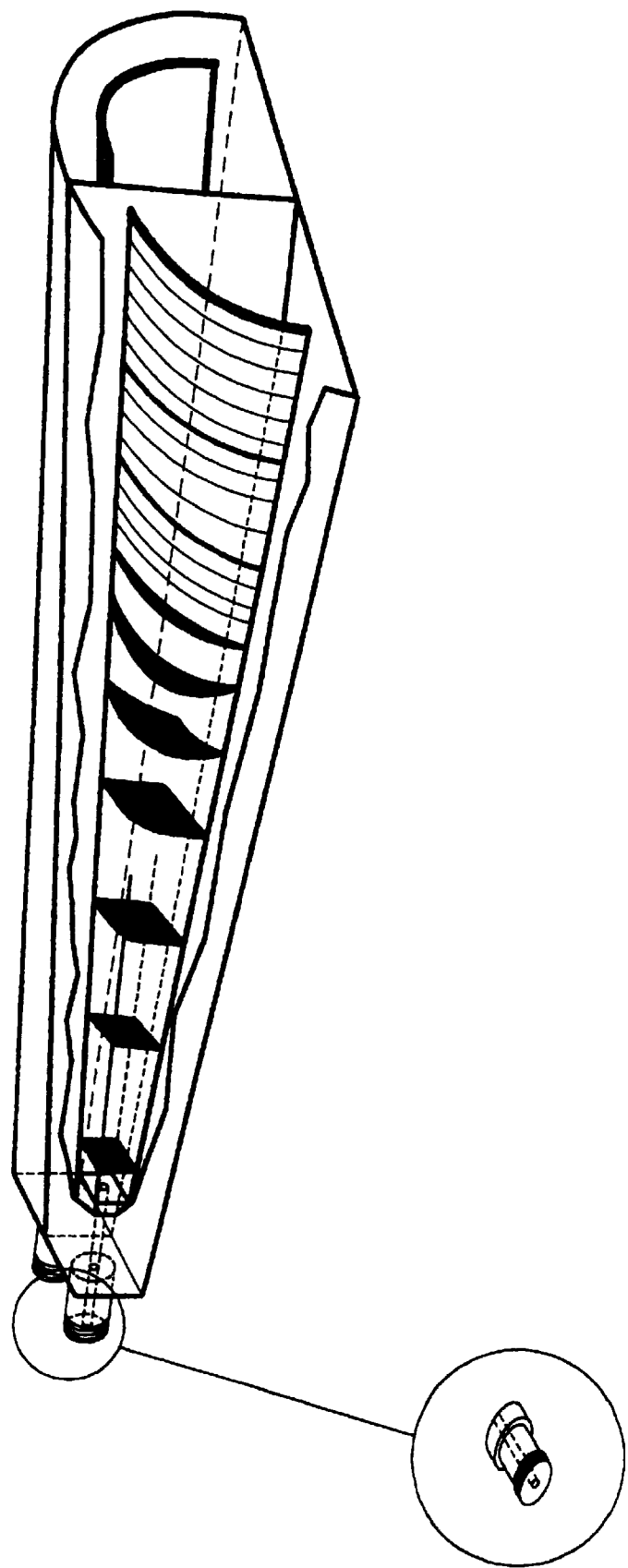
FIG. 20A shows details of the signal feed to the simulator of FIG. 20.

FIG. 20 shows a still further embodiment of the simulator in which a semi-conical signal feed similar to the full conical feed of FIGS. 16 and 17 is employed. A semi-conical horn 160 has a section 161 divided into two quadrants by a vertical partition in the primary section. The signal feed section 161 corresponds to the upper half of the feed structure shown in FIG. 18 and is shown in greater detail in FIG. 20A. After plane 162 the partition wall decreases in height to zero along its length. The septums expand, maintaining the same spacing from the inside conical surface of the horn.

The end of each septum is connected to a curved array 162, 163 contained in a semi-cylindrical housing 164. The floor of housing 164 is conducting and the inner, semi-cylindrical surface is anechoic. By adjusting the relative phase of the signal feeds to horn 160, the direction of polarization of the field in the test area can be varied.

Figure 21:
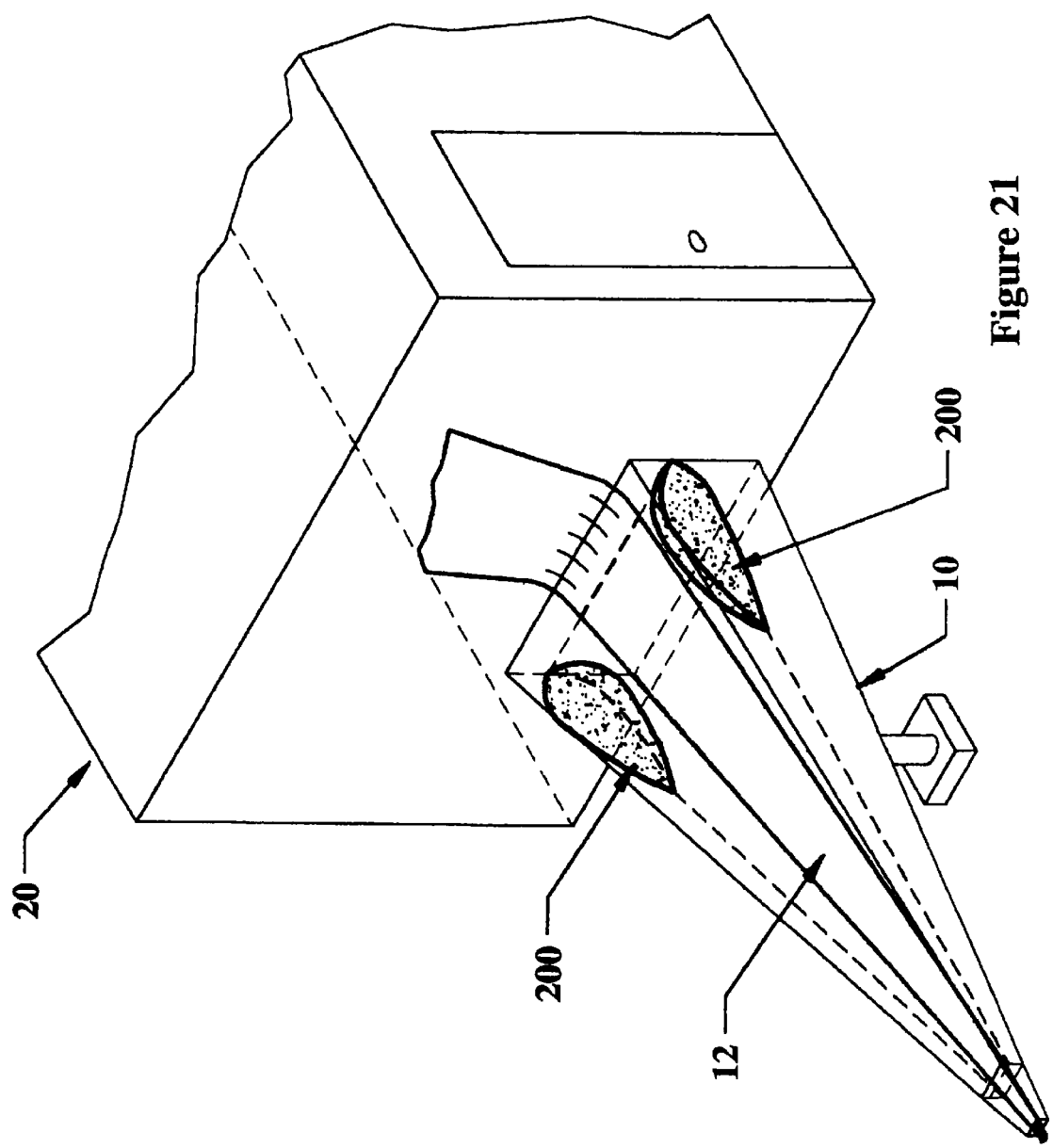
FIG. 21 shows a modification to the simulator of FIG. 1 to provide improved field uniformity in the test area.

FIG. 21 shows a modification to the simulator of FIG. 1 with the object of improving field uniformity in the test area. Due to interference which occurs between those fields at the edges of the septum positioned just above and just below the plane of the septum, portions at the edges of the test area can contain null signals. To avoid this, elements 200 of absorbing material are provided on the inner vertical walls of the horn, generally aligned with the plane of the septum, but extending slightly further above than below that plane.

Figure 22:
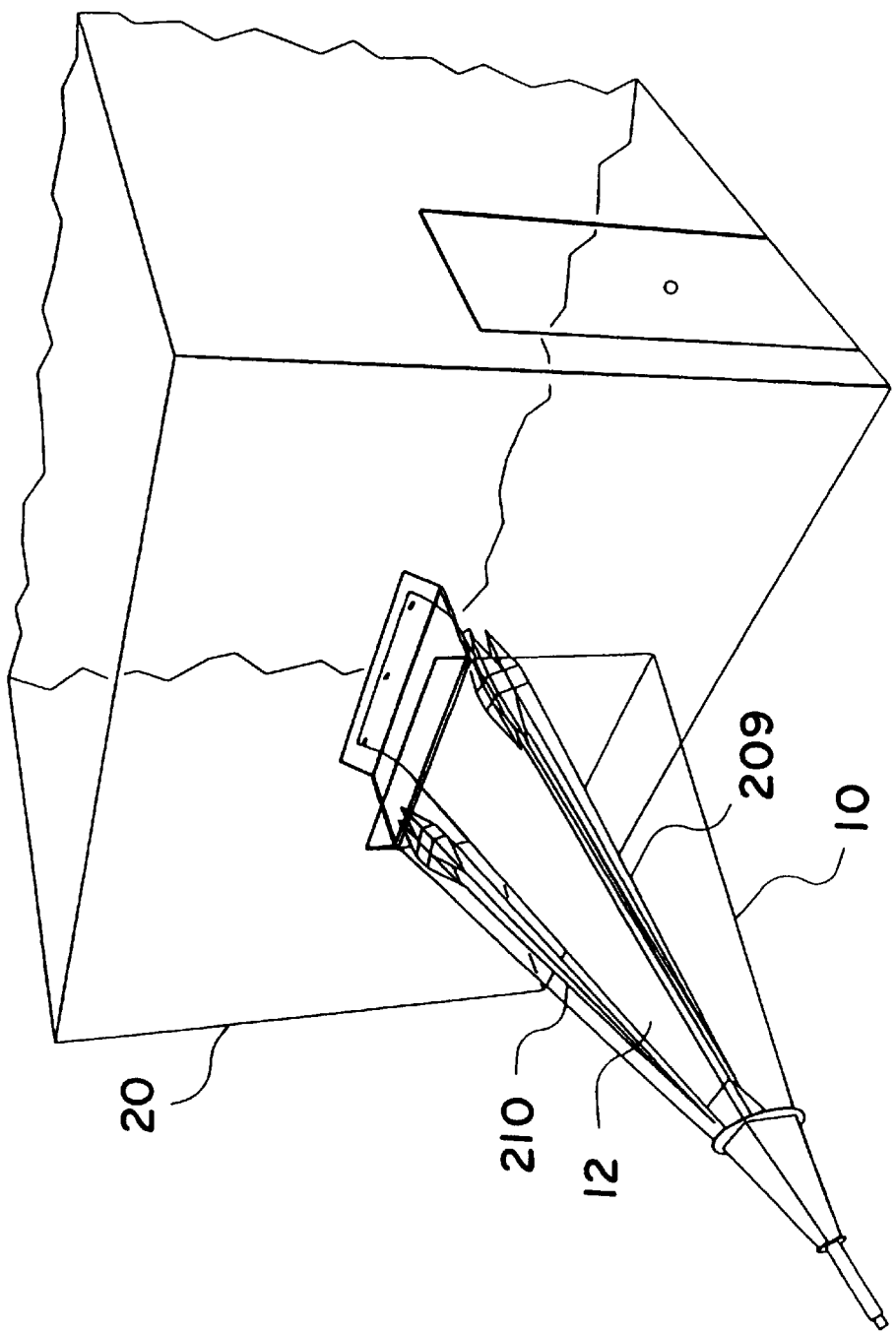
FIG. 22 shows a modification to the simulator of FIG. 1, capable of multi-octave bandwidth operation and having maximum frequency of operation higher than 1 GHz at low and medium power levels.
Figure 23:
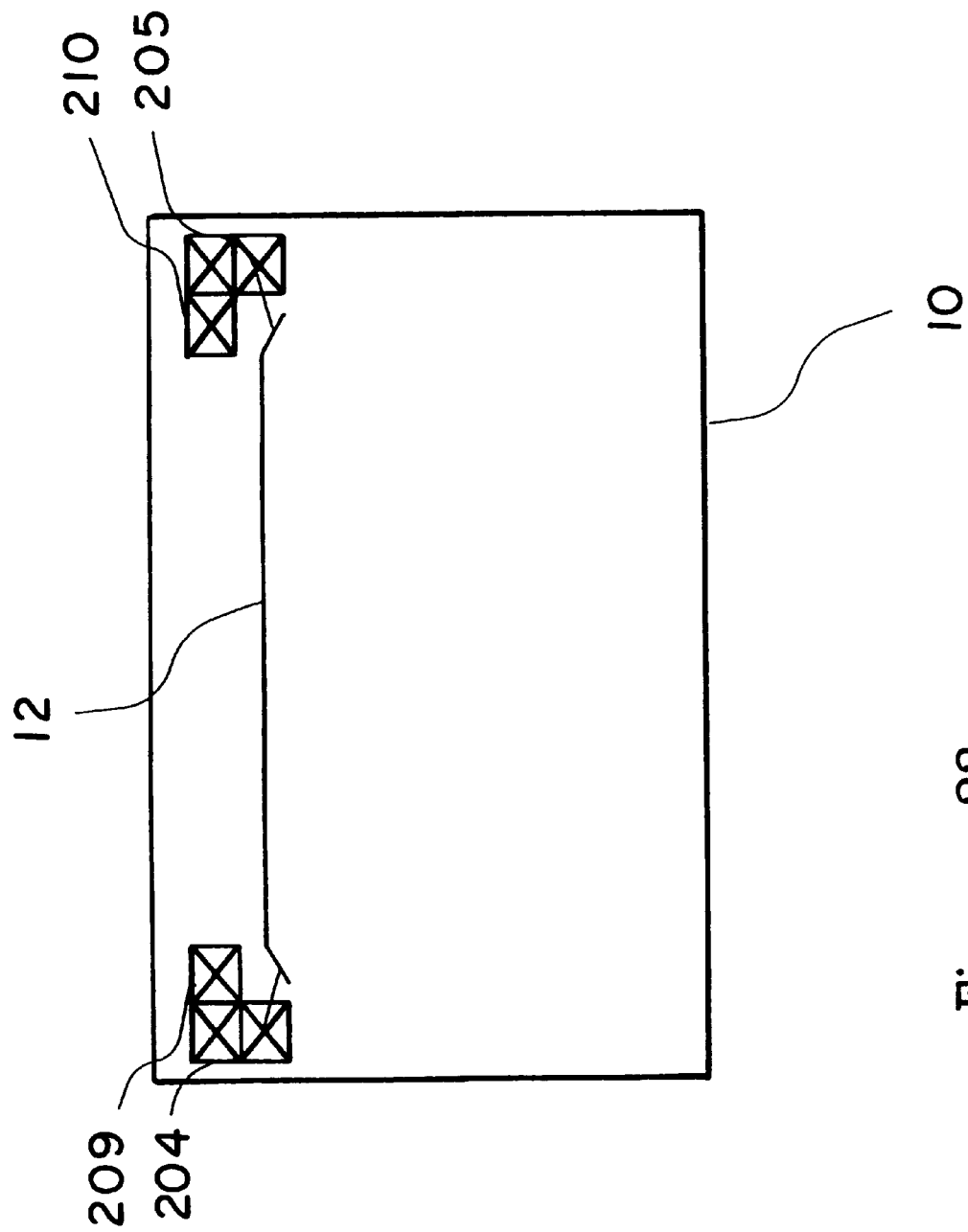
FIG. 23 shows a cut through the perspective view of the broadband TEM-horn antenna of FIG. 22.
Figure 24:
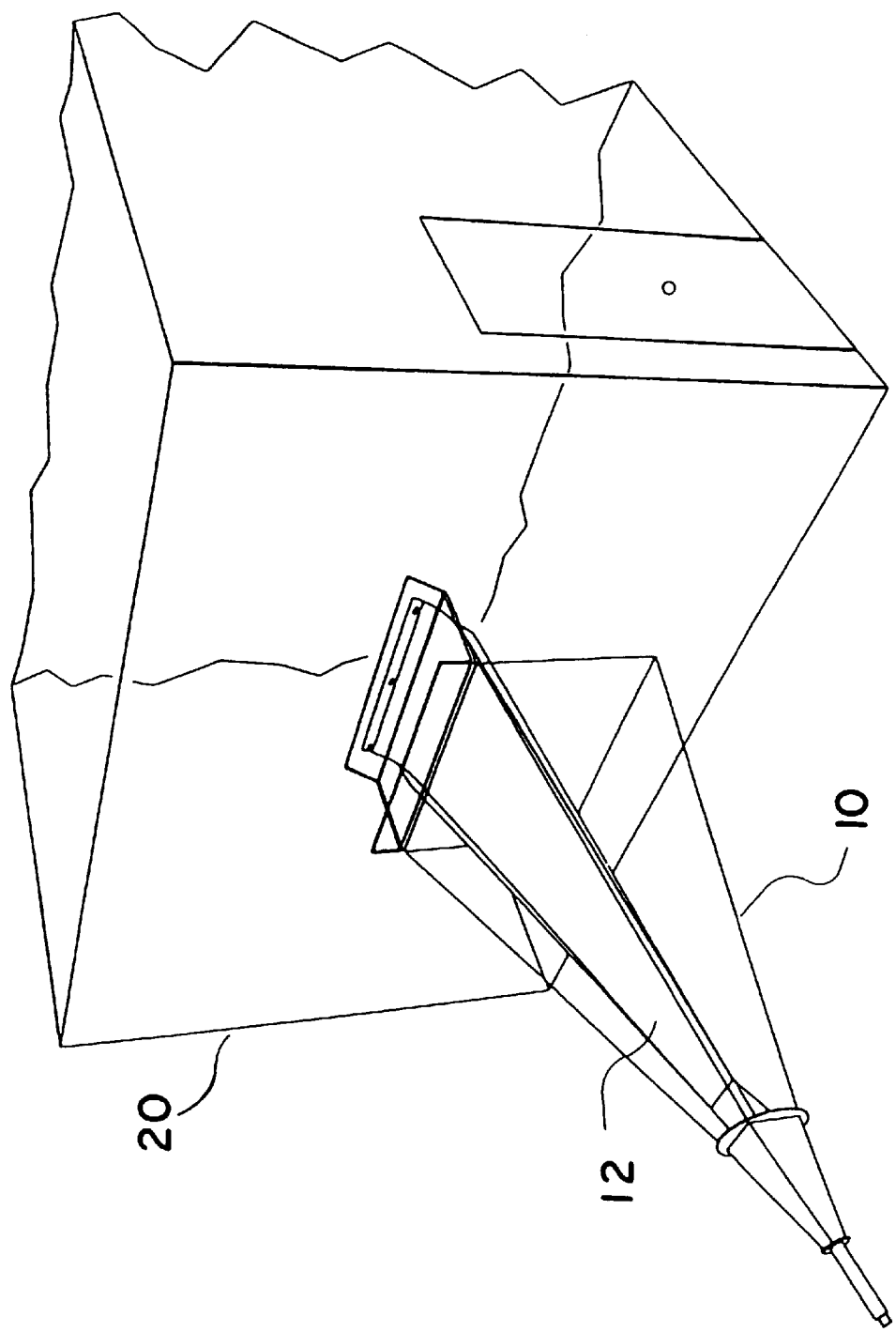
FIG. 24 shows another modification to the simulator of FIG. 1, capable of multi-octave bandwidth operation and having maximum frequency of operation higher than 1 GHz at high power levels.
Figure 25:
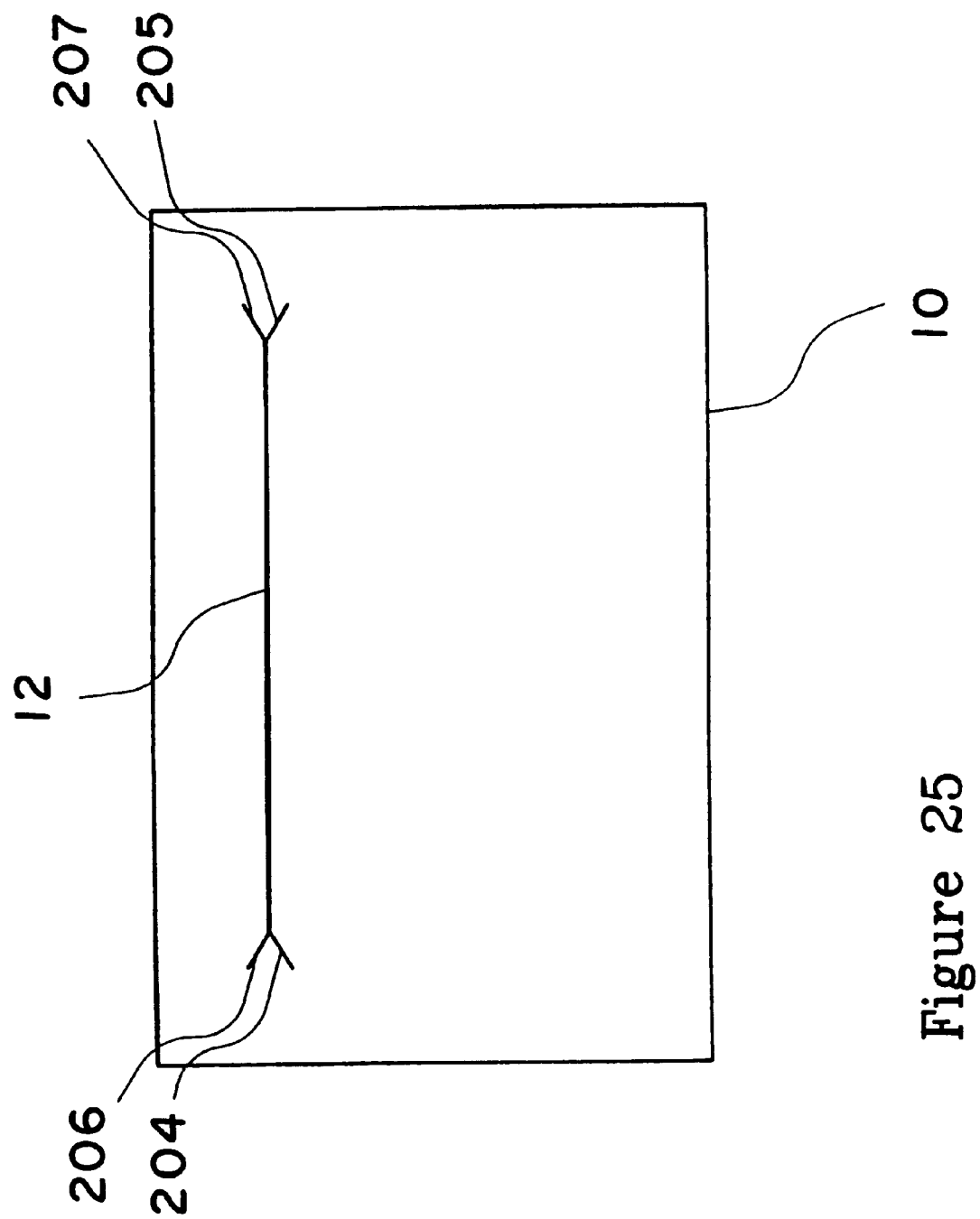
FIG. 25 shows a cut through the perspective view of the broadband TEM-horn antenna of FIG. 24.

FIG. 22 shows a modification to the simulator of FIG. 1, intended to improve field uniformity in the test area at frequencies higher than 1 GHz. For frequencies higher than 1 GHz, due to the interference caused by the dielectric support of the septum (12), the field in the testing area (26) is not uniform and it can contain null signals. To avoid this condition, the septum (12) is bent (204 and 205), to provide the septum rigidity and to allow the septum self-support at the beginning and the end of septum—see FIG. 23. However, bending of septum results in distortion of the field in the test area (26). Such field distortion originates at the edges of the bent septum (204 and 205) and it can be eliminated through an addition of absorbing material (209 and 210). Addition of absorbing material (209 and 210) results in limitation of maximum power handling capabilities of the simulator. To avoid this limitation of the maximum power, further modification to the simulator is necessary—see FIG. 24. In FIG. 24, the absorbers (209 and 210) are removed and the rigidity of the septum (12) is assured through an addition of upper (206 and 207) and lower (204 and 205) bends at the edges of the septum (12)—see FIG. 25.

What is claimed is:

1. An electromagnetic field simulator comprising:

a chamber defining a test area;

a conical radiating horn positioned on one wall of the chamber and supplying energy thereto, the initial section of the horn being divided into electrically isolated quadrants with a separate feed for each quadrant;

two opposed pairs of conducting septum extending along the horn beyond the termination of the quadrant dividers and symmetrically positioned around the horn adjacent the inner wall thereof;

each conducting septum being coupled to a conducting array extending within the chamber towards an opposite wall thereof;

whereby each opposed pair of septum and associated arrays establishes an electromagnetic field of one polarization in the test area, the fields thus established being of different polarizations.

2. A simulator as in claim 1 wherein the initial section of each quadrant contains an elongate conductor of cross-section varying from rectangular adjacent the feed to arc-segment shape adjacent the septum; the quadrant dividers tapering inwardly along the horn to the centre line.

3. An electromagnetic field simulator comprising:

a chamber defining a test area;

a semi-conical radiating horn positioned on one wall of the chamber and supplying energy thereto, the initial section of the horn containing a divider defining electrically isolated halves with a separate feed for each half;

two conducting septum extending along the horn beyond the termination of the divider and positioned 90° apart around the horn and adjacent the inner wall thereof;

each conducting septum being coupled to a conducting array extending within the chamber towards an opposite wall thereof;

whereby each septum and associated array establishes an electromagnetic field of one polarization in the test area, the fields thus established being of different polarizations.

4. A simulator as in claim 3 wherein the initial section of each half contains an elongate conductor of cross section varying from rectangular adjacent the feed to arc-segment shape adjacent the septum; the divider tapering inwardly along the horn to the centre line.

* * * * *